US012165891B2

(12) United States Patent
Jing

(10) Patent No.: US 12,165,891 B2
(45) Date of Patent: Dec. 10, 2024

(54) IDENTIFICATION OF AND COMPENSATION FOR A FAILURE IN A HEATER ARRAY

(71) Applicant: Lam Research Corporation, Fremont, CA (US)

(72) Inventor: Changyou Jing, Livermore, CA (US)

(73) Assignee: Lam Research Corporation, Fremont, CA (US)

( * ) Notice: Subject to any disclaimer, the term of this patent is extended or adjusted under 35 U.S.C. 154(b) by 819 days.

(21) Appl. No.: 17/285,900

(22) PCT Filed: Oct. 25, 2019

(86) PCT No.: PCT/US2019/058195
§ 371 (c)(1),
(2) Date: Apr. 15, 2021

(87) PCT Pub. No.: WO2020/092175
PCT Pub. Date: May 7, 2020

(65) Prior Publication Data
US 2021/0384053 A1 Dec. 9, 2021

Related U.S. Application Data

(60) Provisional application No. 62/753,700, filed on Oct. 31, 2018.

(51) Int. Cl.
*H01L 21/67* (2006.01)
*H03K 3/017* (2006.01)
(Continued)

(52) U.S. Cl.
CPC .. *H01L 21/67248* (2013.01); *H01L 21/67115* (2013.01); *H01L 21/67288* (2013.01);
(Continued)

(58) Field of Classification Search
CPC ......... H01L 21/67248; H01L 21/67115; H01L 21/67288; H03K 3/017; H05B 1/0233
(Continued)

(56) References Cited

U.S. PATENT DOCUMENTS 8,519,762 B2    8/2013  Zhu
9,201,106 B1 *  12/2015 Chai ..................... G06F 3/0443
(Continued)

OTHER PUBLICATIONS

ISR & Written Opinion PCT/US2019/058195, dated Feb. 17, 2020, 10 pages.

*Primary Examiner* — Eric S Stapleton
*Assistant Examiner* — Yeong Juen Thong
(74) *Attorney, Agent, or Firm* — PENILLA IP, APC

(57) ABSTRACT

Systems and methods for identifying a single failure in a heater array and compensating for the failure are described. The methods include identifying two X buses and two Y buses of the heater array having a location of the failure. A confirmation of the single failure within the heater array is performed after identifying the two X and two Y buses. Once the single failure is confirmed, the location of the failure is identified. The methods include compensating for the single failure by adjusting a duty cycle of a heater at the location of the failure, adjusting additional duty cycles of heaters along the same X bus as the failed heater and the same Y bus as the failed heater, and maintaining remaining duty cycles of power provided to remaining heaters of the heater array.

16 Claims, 17 Drawing Sheets

(51) Int. Cl.
*H03K 5/156* (2006.01)
*H05B 1/02* (2006.01)

(52) U.S. Cl.
CPC ........... *H03K 3/017* (2013.01); *H03K 5/1565* (2013.01); *H05B 1/0233* (2013.01)

(58) Field of Classification Search
USPC .............................................. 219/444.1, 531
See application file for complete search history.

(56) References Cited

U.S. PATENT DOCUMENTS

| | | |
|---|---|---|
| 2010/0219962 A1 | 9/2010 | Brochu et al. |
| 2011/0169493 A1 | 7/2011 | Notohamiprodjo et al. |
| 2015/0171834 A1 | 6/2015 | Arp et al. |
| 2017/0012424 A1 | 1/2017 | Schweitzer, III et al. |
| 2019/0179446 A1* | 6/2019 | Kremin ................. G06F 3/0416 |

* cited by examiner (Heater Addressing)

When X1Y1 is addressed, its current has $N_1$ + UW1
When X6Y1 is addressed, its current has $N_2$ + UW2
X1Y1 & X6Y1 <u>symmetry remains.</u> So does $X1Y_i$ & $X6Y_i$, i=2,4,5,6

When X1Y3 is addressed, its current has $N_1'$ (No unwanted)
When X6Y3 is addressed, its current has $N_2'$ (No unwanted)
Thus, X1Y3 & X6Y3 <u>symmetry remains</u>

When X2Y1 is addressed, its current = $N_3$ (No unwanted)
When X5Y1 is addressed, its current = $N_4 + UW4$
Symmetry between X2Y1, & X5Y1 does not exist
The <u>asymmetry</u> is true to $X2Y_i$ & $X5Y_i$, i=2,4,5,6

When X2Y3 is addressed, its current = $N_3'$
When X5Y3 is addressed, its current = $N_4'$
The symmetry between X2Y3 & X5Y3 remains (Confirmation of single failure)

(Confirmation of single failure)

(More than one failure)

(More than one failure)

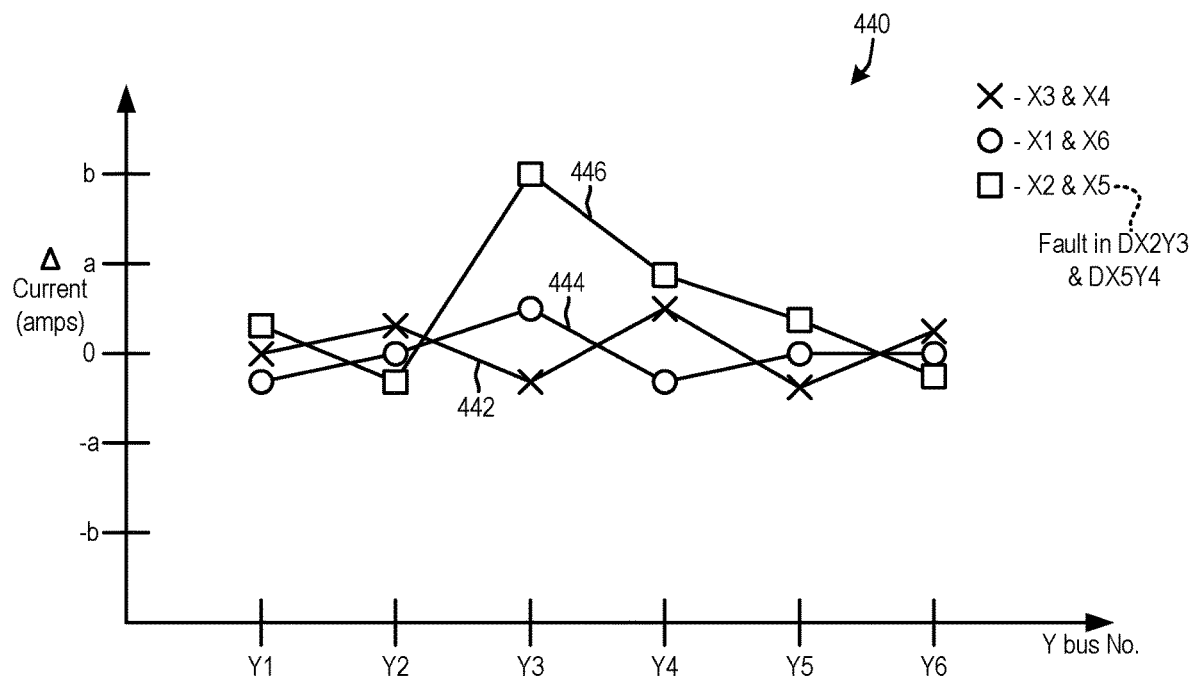
FIG. 4E (Symmetric Fault)
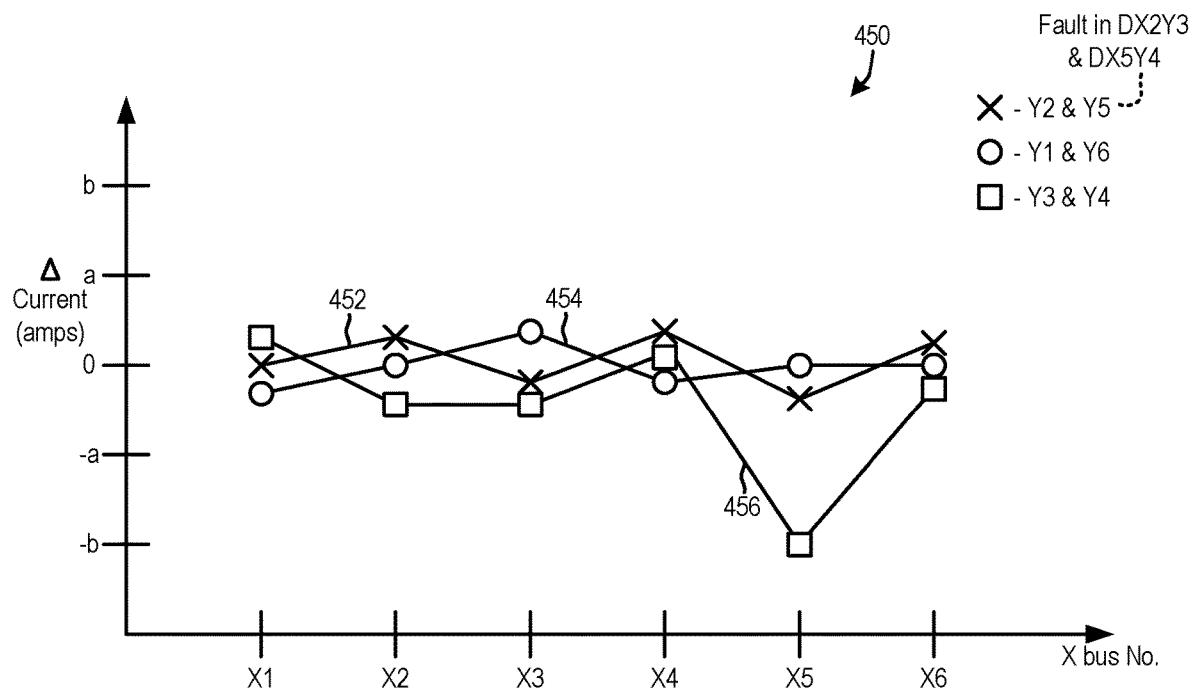
FIG. 4F (Symmetric Fault)

(Identification of failure location)

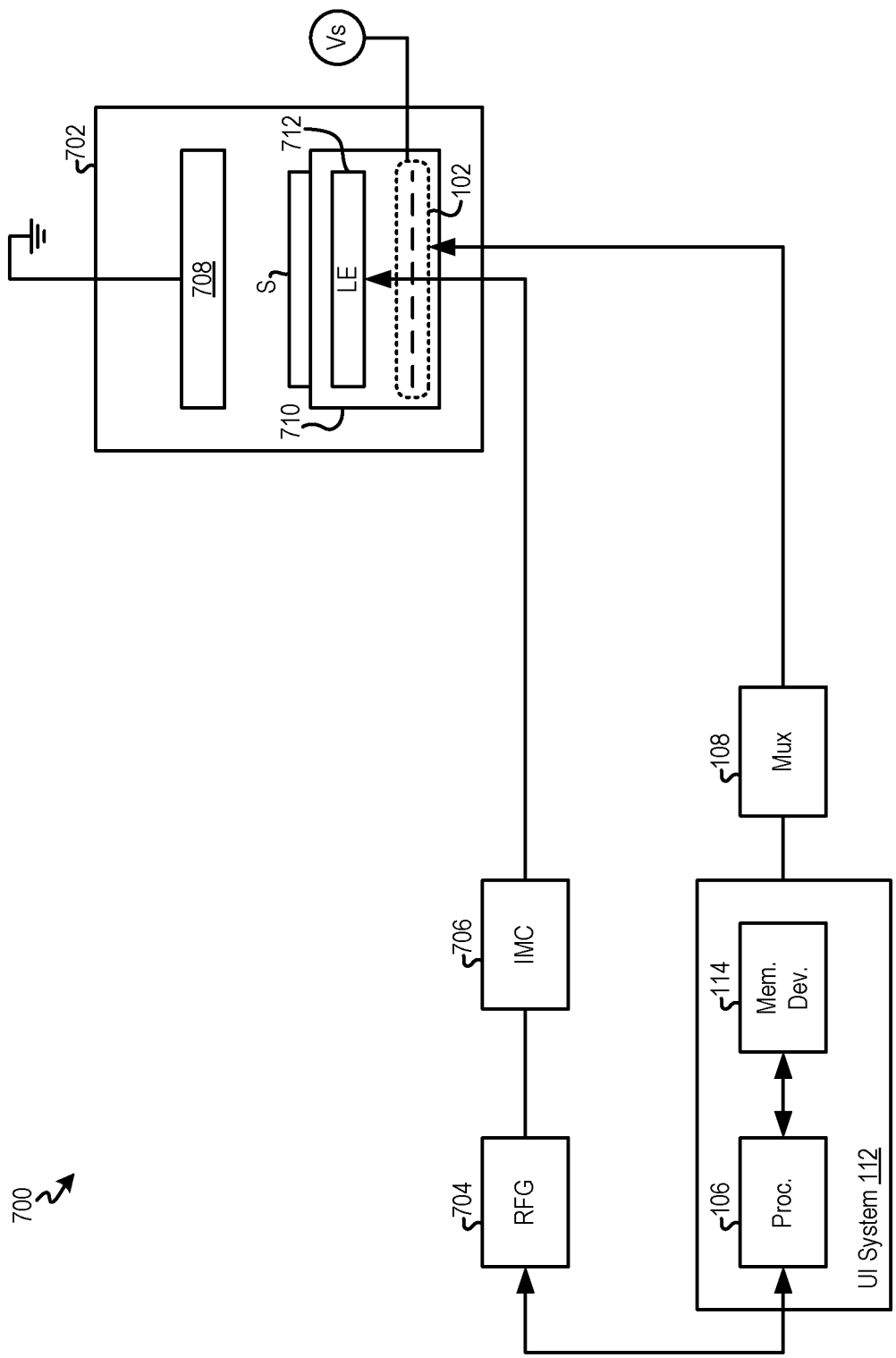
FIG. 7 (CCP)

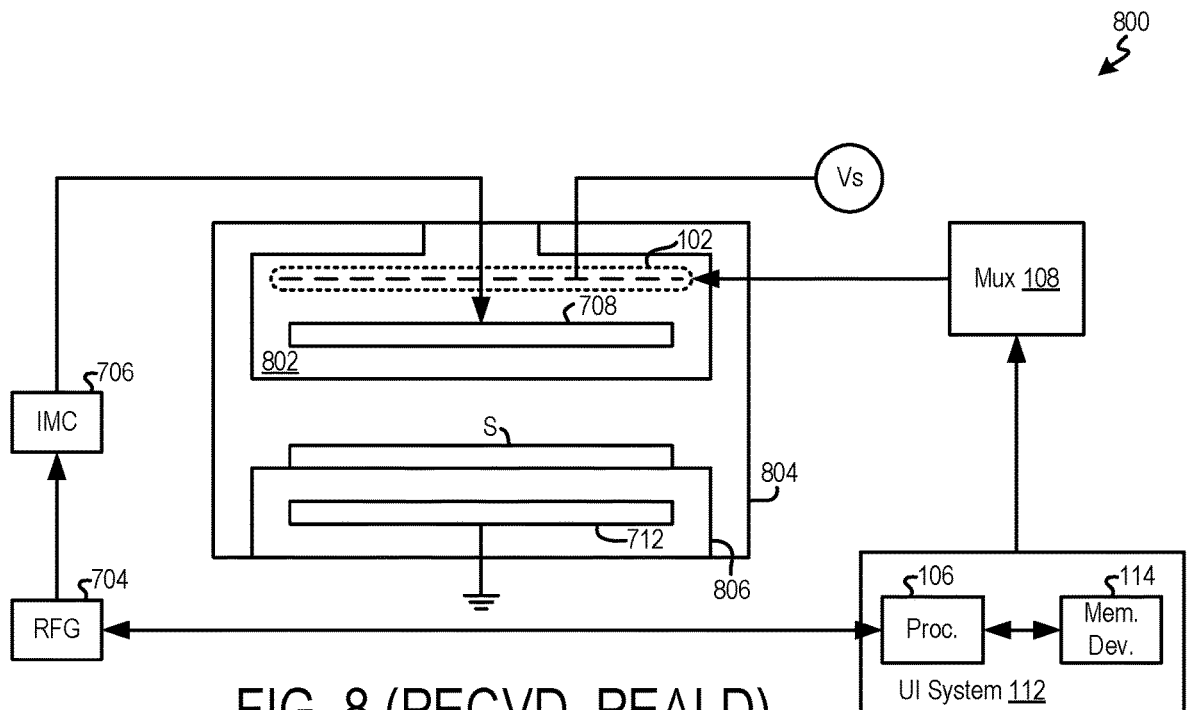
FIG. 8 (PECVD, PEALD)
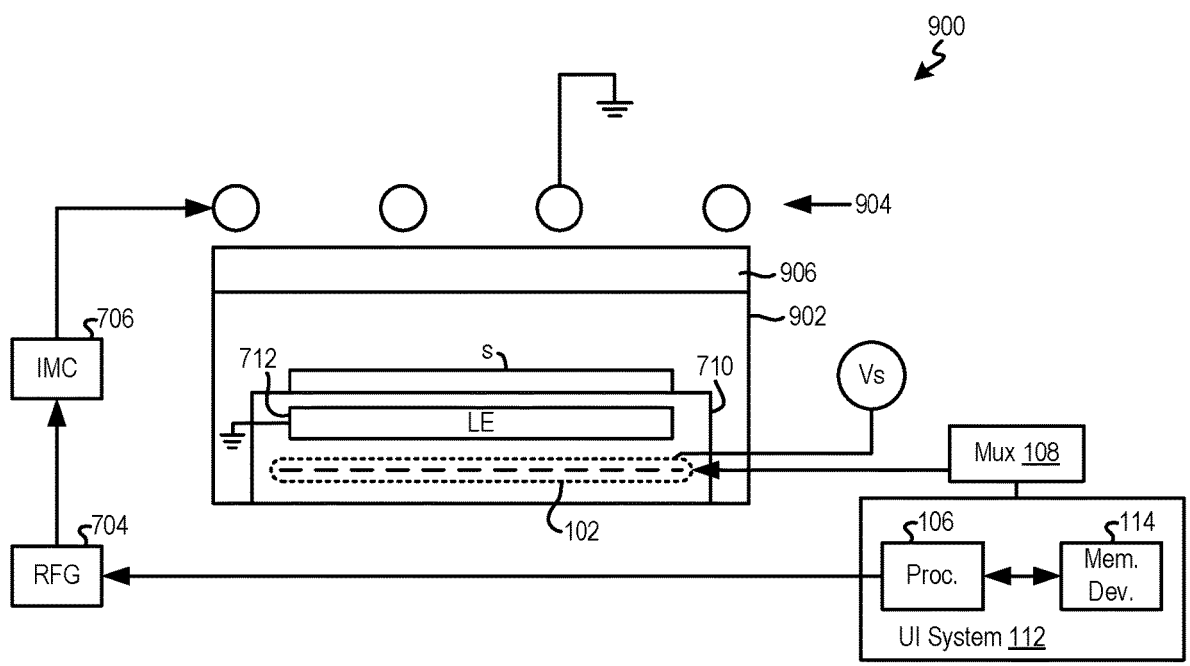
FIG. 9 (ICP)

IDENTIFICATION OF AND COMPENSATION FOR A FAILURE IN A HEATER ARRAY

CLAIM OF PRIORITY

This application is a national stage filing of and claims priority, under 35 U.S.C. § 371, to PCT/US2019/058195, filed on Oct. 25, 2019, and titled "IDENTIFICATION OF AND COMPENSATION FOR A FAILURE IN A HEATER ARRAY", which claims priority, under 35 U.S.C. § 119(e), to U.S. Provisional Application No. 62/753,700, filed on Oct. 31, 2018, and titled "IDENTIFICATION OF AND COMPENSATION FOR A FAILURE IN A HEATER ARRAY", both of which are incorporated by reference herein in their entirety.

FIELD

The present disclosure relates to systems and methods for identification of a failure in a heater array and compensation for the failure.

BACKGROUND

A plasma tool includes a radio frequency (RF) generator and a plasma chamber. The RF generator is coupled to the plasma chamber via a match. The RF generator generates an RF signal and supplies the RF signal to the plasma chamber via the match.

A substrate is processed within the plasma chamber using plasma that is generated when the RF signal is supplied to the plasma chamber in addition to one or more gases. During processing of the substrate, temperature within the plasma chamber is controlled. To control the temperature, one or more heaters within the plasma chamber are controlled.

It is in this context that embodiments described in the present disclosure arise.

The background description provided herein is for the purposes of generally presenting the context of the disclosure. Work of the presently named inventor, to the extent it is described in this background section, as well as aspects of the description that may not otherwise qualify as prior art at the time of filing, are neither expressly nor impliedly admitted as prior art against the present disclosure.

SUMMARY

Embodiments of the disclosure provide systems, apparatus, methods and computer programs for identification of a failure in a heater array and compensation for the failure. It should be appreciated that the present embodiments can be implemented in numerous ways, e.g., a process, an apparatus, a system, a device, or a method on a computer readable medium. Several embodiments are described below.

A component, such as an electrostatic chuck or a showerhead, of a plasma chamber has a heater matrix on which each node, i.e., a heater, has a diode and a resistor heating element. The heater matrix is sometimes referred to herein as the heater array. When the diode fails, multiple unaddressed heaters of the heater matrix will get unwanted bonus current resulting in out-of-control heating profiles on a wafer being processed. The diode failure goes undetected. So when the diode failure occurs, there is no recovery that takes place. After the diode failure is detected, the component is discarded, an operation of a plasma tool having the plasma chamber is stopped, and a replacement component is ordered. Also, any wafers that are processed using the failed diode are discarded. The loss of wafers is very costly. The replacement component is costly. Also, until the replacement component arrives and is fitted within the plasma tool, the plasma tool is nonoperational resulting in system downtime. The systems and methods described herein offer diode failure detection, which can prevent the discarding of the wafers. Also, the systems and methods described herein offer additional time for ordering the replacement part without stopping the plasma tool from running and without jeopardizing a quality of processing the wafers.

The systems and methods described herein provide a single diode failure confirmation, location identification, and recovery. The component with the single diode failure can still be used transparently after the single diode failure, thus extending a life the component, Also, the downtime of the plasma tool is reduced by ordering the replacement component in parallel with using the component having the single diode failure. When the component has additional diode failures, the replacement component is ready for use.

In one embodiment, a method for identification of a failure in the heater array and compensation for the failure is described. The method includes a first operation of confirming that the failure is limited to a single heater, such as a diode short, within the heater array. In case more than one heater fails within the heater array, the component or a part of the plasma tool in which the heater array is situated is to be replaced. The method further includes a second operation of identifying a location of the failure within the heater array. The method includes a third operation of executing a failure recovery process to compensate for the failure at the location.

In an embodiment, the first, second, and third operations are executed in a consecutive order. For example, the second operation is executed after the first operation.

In one embodiment, the heater array, described herein is used for fine temperature control within the plasma chamber. There are larger heaters for course temperature control and the larger heaters are called zone heaters.

In an embodiment, a method for adjusting power supplied to a heater array having a faulty heater is described. The method includes accessing mitigation data that identifies a location of the faulty heater. The faulty heater is located on an X bus and a Y bus. The method further includes adjusting a duty cycle of power to be applied to the faulty heater to output an adjusted duty cycle and applying the adjusted duty cycle to the faulty heater. The adjusted duty cycle reduces power to the faulty heater. The method includes applying additional adjusted duty cycles to a set of heaters on the X bus and the Y bus without adjusting remaining duty cycles applied to remaining heaters of the heater array. The additional adjusted duty cycles reduce power to the set of heaters.

In one embodiment, a system is described. The system includes a heater array having a plurality of X buses, a plurality of Y buses, and a plurality of heaters distributed within a plasma chamber. The system further includes a power delivery circuit for setting a duty cycle of power to each of the plurality of heaters. The power delivery circuit adjusts the duty cycle of a faulty heater of the plurality of heaters and adjusts the duty cycles of power provided to first and second groups of heaters from the plurality of heaters. The plurality of X buses includes an X bus associated with the faulty heater and the plurality of Y buses includes a Y bus associated with the faulty heater. The first group of heaters is located on the X bus associated with the faulty heater and the second group of heaters is located on the Y bus associated with the faulty heater.

In an embodiment, a plasma system is described. The plasma system includes a radio frequency generator configured to generate a radio frequency signal and an impedance matching circuit coupled to the radio frequency generator to receive the radio frequency signal. The impedance matching circuit modifies the radio frequency signal to output a modified radio frequency signal. The plasma system further includes a plasma chamber coupled to the impedance matching circuit to receive the modified radio frequency signal. The plasma chamber includes a heater array, which includes a plurality of X buses, a plurality of Y buses, and a plurality of heaters. The plasma system includes the power delivery circuit, described above, coupled to the plurality of heaters for setting a duty cycle of power to each of the plurality of heaters.

Some advantages of the herein described systems and methods for identification of the failure in the heater array and compensation for the failure include that the component with a single heater failure does not need to be discarded immediately. A life of the component can be extended until two or more heaters within the heater array fail. Also, there is no need to incur costs of a new replacement chuck immediately. Additional advantages of the herein described systems and methods include that confirmation of the failure of the single heater within the heater array and identification of a location of the single heater can be done in-situ on a tool. If the single heater failure is confirmed, then any effect on processing of a substrate due to the failure can be compensated by a recovery mode and the component can still be operated so that the plasma tool continues to be operational for wafer processing. Productivity in processing the wafers is minimally impacted. Further advantages of the herein described systems and methods include that the replacement component, such as the replacement chuck, can be ordered in advance before the component having the fault cannot be recovered due to failures in more than one heater. This allows minimum tool downtime when the component is replaced with the replacement component.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 2A-1 is a diagram of an embodiment of a heater array with a failed heater diode at a location X2Y3 to illustrate symmetry between currents that are metered from heaters at multiple locations of or along an X1 bus and multiple locations of an X6 bus.

FIG. 2A-2 is a diagram of an embodiment of the heater array with the failed heater diode at the location X2Y3 to illustrate that currents are symmetric at locations X1Y3 and X6Y3 of the heater array.

FIG. 2B-1 is a diagram of an embodiment of the heater array with the failed heater diode at the location X2Y3 to illustrate asymmetry between currents that are metered from the heaters at all locations of an X2 bus except for one location along the X2 bus and at all locations of the X5 bus except for one location along the X5 bus.

FIG. 2B-2 is a diagram of an embodiment of the heater array with the failed heater diode at the location X2Y3 to illustrate that currents are symmetric at locations X2Y3 and X5Y3 within the heater array.

FIG. 3A-1 is a diagram of an embodiment of the heater array to illustrate symmetry between currents that are metered from the heaters at multiple locations of a Y1 bus and multiple locations of a Y6 bus of the heater array.

FIG. 3A-2 is a diagram of an embodiment to illustrate that currents are symmetric at locations Y1X2 and Y6X2 of the heater array.

FIG. 3B-1 is a diagram of an embodiment of the heater array to illustrate asymmetry between currents that are metered from the heaters at all locations of a Y3 bus except for one location along the Y3 bus and at all locations of a Y4 bus except for one location along the Y4 bus of the heater array.

FIG. 3B-2 is a diagram of an embodiment to illustrate that currents are symmetric at locations X2Y3 and X2Y4 of the heater array.

FIG. 4E is an embodiment of a graph to illustrate a greater number of failures than the single failure within the heater array.

FIG. 4F is an embodiment of a graph to illustrate a greater number of failures than the single failure within the heater array.

FIG. 7 is a diagram of an embodiment of a capacitively coupled plasma (CCP) system to illustrate use of the heater array within the CCP system.

FIG. 8 is a diagram of an embodiment of a plasma enhanced atomic layer deposition (PEALD) tool or plasma enhanced chemical vapor deposition (PECVD) tool to illustrate use of the heater array to illustrate use of the heater array within the PEALD or PECVD system.

FIG. 9 is a diagram of an embodiment of an inductively coupled plasma (ICP) system to illustrate use of the heater array within the ICP system.

DETAILED DESCRIPTION

The following embodiments describe systems and methods for real-time control of temperature in a plasma chamber. It will be apparent that the present embodiments may be practiced without some or all of these specific details. In other instances, well known process operations have not been described in detail in order not to unnecessarily obscure the present embodiments.

Figure 1:
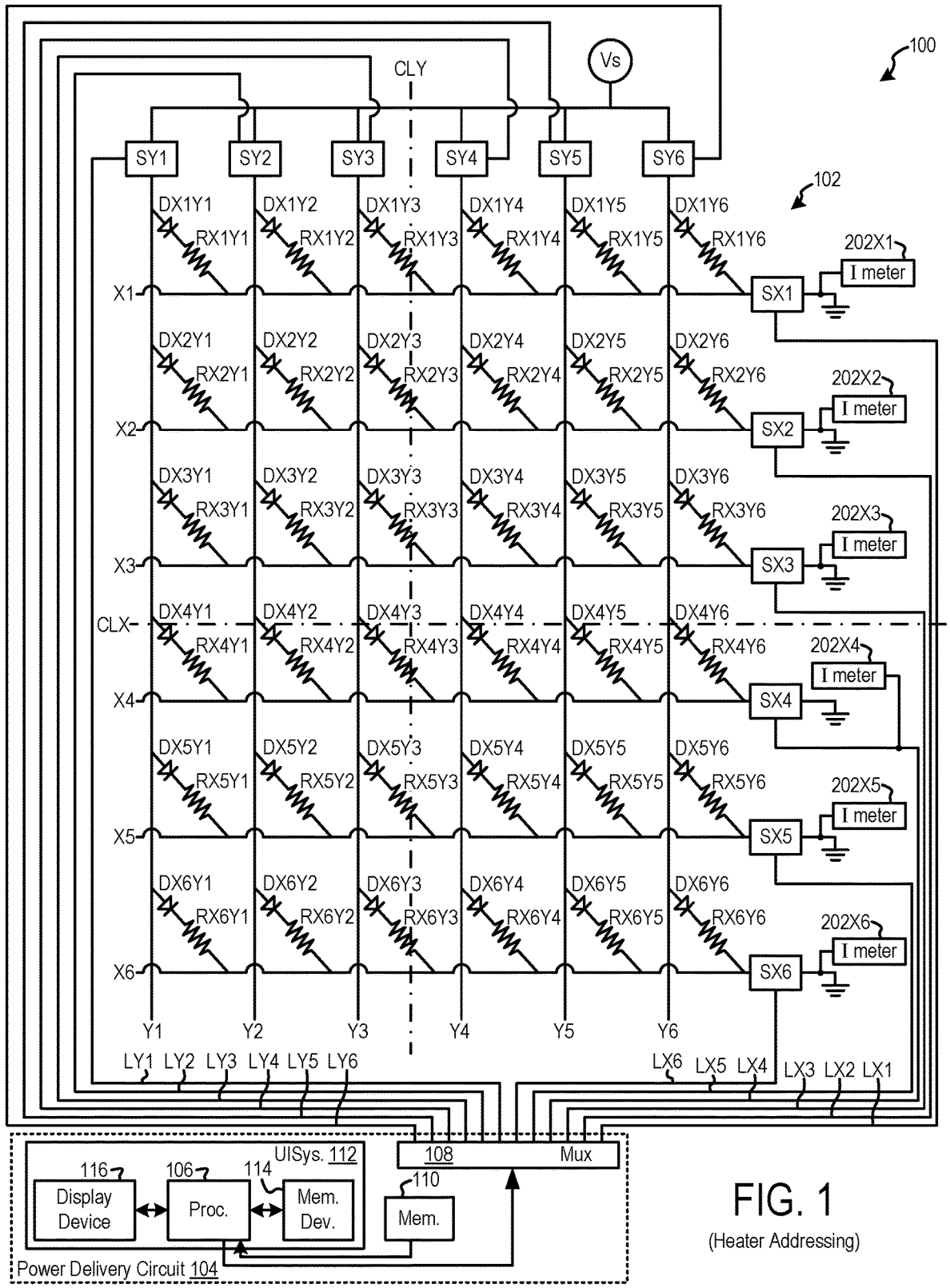
FIG. 1 is a diagram of an embodiment of a system to illustrate real-time control of temperature within a plasma chamber by controlling multiple heaters.

FIG. 1 is a diagram of an embodiment of a system 100 to illustrate real-time control of temperature within a plasma chamber by controlling multiple heaters. The system 100 includes a voltage source Vs, a heater array 102, a multiplexer 108, a non-volatile memory 110, and a user interface system (UIS) 112. A multiplexer, as used herein, is fabricated as a printed circuit board assembly (PCBA). For example, the terms multiplexer and PCBA are used herein interchangeably. Examples of a non-volatile memory, as used herein, include a flash memory and a ferroelectric random access memory (RAM). An example of the voltage source Vs includes a power supply. To illustrate, the voltage source Vs supplies an amount of voltage. The heater array 102 is located within a substrate support, a chuck, a showerhead, or an upper electrode assembly. The upper electrode assembly includes an upper electrode and other components, such as a dielectric that surrounds the upper electrode and an upper electrode extension that surrounds the dielectric. Examples of the user interface system 112 include a host computer, a desktop computer, a laptop computer, a smart phone, and a server. The user interface system 112, the multiplexer 108, and the non-volatile memory 110 are parts or components of a power delivery circuit 104.

The heater array 102 includes multiple switches SX1, SX2, SX3, SX4, SX5, SX6, SY1, SY2, SY3, SY4, SY5, and SY6. In addition, the heater array 102 includes multiple X buses X1, X2, X3, X4, X5, X6, and multiple Y buses Y1, Y2, Y3, Y4, Y5, and Y6. The heater array 102 includes multiple locations and each location includes a heater. The heaters of the heater array 102 are distributed to form a heater matrix. A location XjYi of the heater array 102 includes a heater that further includes a diode DXjYi and a resistor RXjYi, where j ranges from 1 to 6 and i ranges from 1 to 6. For example, a location X1Y1 of the heater array 102 includes a heater that includes a diode DX1Y1 and a resistor RX1Y1 and another location X2Y2 of the heater array 102 includes a diode DX2Y2 and a resistor RX2Y2. A diode of a heater at a location is coupled in series to a resistor of the heater. An example of a bus, as used herein, is a conductor, such as a wire. An example of a switch, as used herein, is a relay. As another example, a switch, as used herein, includes one or more transistors that are coupled to each other.

The multiplexer 108 is coupled via a line LY1 to the switch SY1, via a line LY2 to the switch SY2, via a line LY3 to the switch SY3, via a line LY4 to the switch SY4, via a line LY5 to the switch SY5, via a line LY6 to the switch SY6, via a line LX1 to the switch SX1, via a line LX2 to the switch SX2, via a line LX3 to the switch SX3, via a line LX4 to the switch SX4, via a line LX5 to the switch SX5, via a line LX6 to the switch SX6. An example of a line, as used herein, is a conductor, such as a wire.

The user interface system 112 includes a processor 106, a memory device 114, and a display device 116. As used herein, a processor is an application specific integrated circuit (ASIC), or a field programmable gate array (FPGA), a programmable logic device (PLD), or a central processing unit (CPU), or a microprocessor, or a digital signal processor, or a microcontroller. Examples of a memory device, as used herein, include a random access memory (RAM) and a read-only memory (ROM). To illustrate, a memory device is a flash memory, a hard disk, or a storage device, etc. A memory device is an example of a computer-readable medium. Examples of the display device 116 include a liquid crystal display device, a light emitting diode display device, and a plasma display device.

The nonvolatile memory 110 includes one or more mappings, such as a one-to-one relationship, or a correspondence, or a link, or a unique relationship, etc., among a temperature value to be achieved within the plasma chamber, duty cycles of operation of the heaters of the heater array 102, and a nominal value of the voltage to be generated by the voltage source Vs. For example, to achieve a temperature value Temp1 within a plasma chamber that includes the heater array 102, the voltage source Vs is to be operated to generate a nominal voltage amount Vnominal1, the heater at the location X1Y1 is to be operated at a duty cycle DCX1Y1, the heater at the location X1Y2 is to be operated at a duty cycle DCX1Y2 and so on until the heater at the location X6Y6 is to be operated at a duty cycle DCX6Y6. The duty cycle of operation of a heater of the heater array 102 is a duty cycle or an amount of time within a clock cycle for which power is provided from the voltage source Vs to the heater.

It should further be noted that the non-volatile memory 110 is preloaded with mappings that are specific to the heater array 102 upon delivery of the heater array 102 to a user. As another example, the duty cycles of the heaters of the heater array 102 are pre-calibrated at a factory in which the heater array 102 is fabricated with an assumption that the voltage source Vs will generate and supply voltage at a constant value, such as the nominal value Vnominal1. Information regarding off and on time periods of the duty cycles of the heaters of the heater array 102 are calculated and stored in the non-volatile memory 110 at the factory prior to delivery to the user.

The processor 106 receives or accesses the one or more mappings from the non-volatile memory 110 and identifies from the one or more mappings the duty cycles at which the heater elements of the heater array 102 within a plasma chamber are to be operated to achieve the temperature value Temp1 within the plasma chamber. The voltage source Vs is capable of generating a nominal voltage value for achieving the temperature value. The temperature value Temp1 is to be achieved as a part of a recipe for processing a substrate within the plasma chamber having the heater array 102. As used herein, an example of a substrate includes a semiconductor wafer, which can be a test wafer or a wafer that is to be processed. For example, the substrate includes multiple stack layers that are overlaid on a substrate layer, such as silicon. The recipe includes other values, such as an operating frequency of a radiofrequency (RF) generator, an operating power level of the RF generator, a gap between the upper electrode and a lower electrode within the plasma chamber, an amount of pressure within the plasma chamber, and a chemistry of process gases to be supplied within the plasma chamber. The processor 106 accesses the recipe, which is stored in the memory device 114, and controls the RF generator and the plasma chamber having the heater array 102 accordingly to carry out the recipe.

During processing of the substrate within the plasma chamber having the heater array 102, the voltage source Vs generates a nominal voltage value for supply to one or more of the heaters of the heater array 102. Moreover, during processing of the substrate, the processor 106 identifies from the recipe that the temperature value Temp1 is to be achieved within the plasma chamber in which the heater array 102 is located. When the substrate is being processed, the processor 106 sends duty-cycle control signal(s) to the multiplexer 108 for addressing one or more X buses and one or more Y buses of the heater array to control the heaters of the heater array 102 to set or achieve their respective duty cycles. The duty-cycle control signal(s) includes frequencies for opening and closing the switches SX1 through SX6 and SY1 through SY6 to achieve the duty cycles of the heater elements of the heater array 102.

Upon receiving the duty-cycle control signal(s), the multiplexer 108 manages closing and opening of the switches SX1 through SX6 and SY1 through SY6 accordingly to achieve the duty cycles of operation of the heaters of the heater array 102. For example, upon receiving a duty-cycle control signal to close the switches SY1 and SX1 and to open remaining of the switches SY2 through SY6 and SX2 through SX6, the multiplexer 108 sends a signal via the LY1 to the switch SY1 to close the switch SY1, sends another signal via the line LX1 to the switch SX1 to close the switch SX1, stops sending signals via the lines LX2 through LX6 to the switches SX2 through SX6 to open the switches SX2 through SX6, and stops sending signals via the lines LY2 through LY6 to the switches SY2 through SY6 to open the switches SY2 through SY6. During a time period in which the switches SY1 and SX1 are closed and the remaining switches SX2 through SX6 and SY2 through SY6 are open, a current generated by a nominal voltage output from the voltage source Vs is transferred via the switch SY1, the bus Y1, the diode DX1Y1, the resistor RX1Y1, the bus X1, and the switch SX1 to a ground potential. The current that flows through the heater at the location X1Y1 also flows through a current meter 202X1 that is coupled to a terminal of the switch SX1. Thus, the current that flows through the heater at the location X1Y1 is metered or monitored while the duty cycle of the heater at the location X1Y1 is controlled by the multiplexer 108. The metered current is sent from the current meter 202X1 to the processor 106. One or more of additional current meters 202X2, 202X3, 202X4, 202X5, and 202X6 are described below.

Continuing with the example, upon receiving another duty-cycle control signal to open the switches SY1 and SX1 and to maintain remaining of the switches SY2 through SY6 and SX2 through SX6 open, the multiplexer 108 stops sending the signal via the LY1 to the switch SY1 to open the switch SY1 and stops sending the signal via the line LX1 to the switch SX1 to open the switch SX1. When the switches SY1 and SX1 are open, a current generated by a nominal voltage output from the voltage source Vs is not transferred via the switch SY1, the bus Y1, the diode DX1Y1, the resistor RX1Y1, the bus X1, and the switch SX1 to the ground potential. A duty cycle of the heater at the location X1Y1 is achieved or set for a time period of a cycle of a clock signal for which the switches SX1 and SY1 are closed and the remaining switches SX2 through SX6 and SY2 through SY6 are open. In a similar manner, duty cycles and the metered current of remaining heaters at remaining locations within the heater array 102 are controlled by the processor 106 via the multiplexer 108.

Due to an application and a construction or fabrication of the heater array 102, heaters that are mirrored along a center line or a center x-axis CLX, or a center y-axis or a center line CLY have similar resistance, and thus have approximately the same amount of current. For example, the heaters at the locations X1Y1 and X6Y1 are mirrored along the center x-axis CLX and have approximately the same amount of current, the heaters at the locations X2Y2 and X5Y2 are mirrored along the center x-axis CLX and have approximately the same amount of current, the heaters at the locations X1Y1 and X1Y6 are mirrored along the center y-axis CLY and have approximately the same amount of current, and the heaters at the locations X2Y2 and X2Y5 are mirrored along the center y-axis CLY and have approximately the same amount of current.

In some embodiments, the heater array 102 includes any number of heaters, any number of switches, and any number of buses. For example, the heater array 102 includes 144 heaters. As another example, the heater array 102 includes 100 heaters.

In various embodiments, instead of a ground potential, a reference potential, such as a positive amount of potential or a negative amount of potential is used. The positive amount of potential and the negative amount of potential are less than a potential of the voltage source Vs.

In one embodiment, the power delivery circuit 104 includes the user interface system 112, the multiplexer 108, the memory 110, the switches SX1 through SX6, the switches SY1 through SY6, the buses X1 through X6, and the buses Y1 through Y6.

Figures 1, 2A:
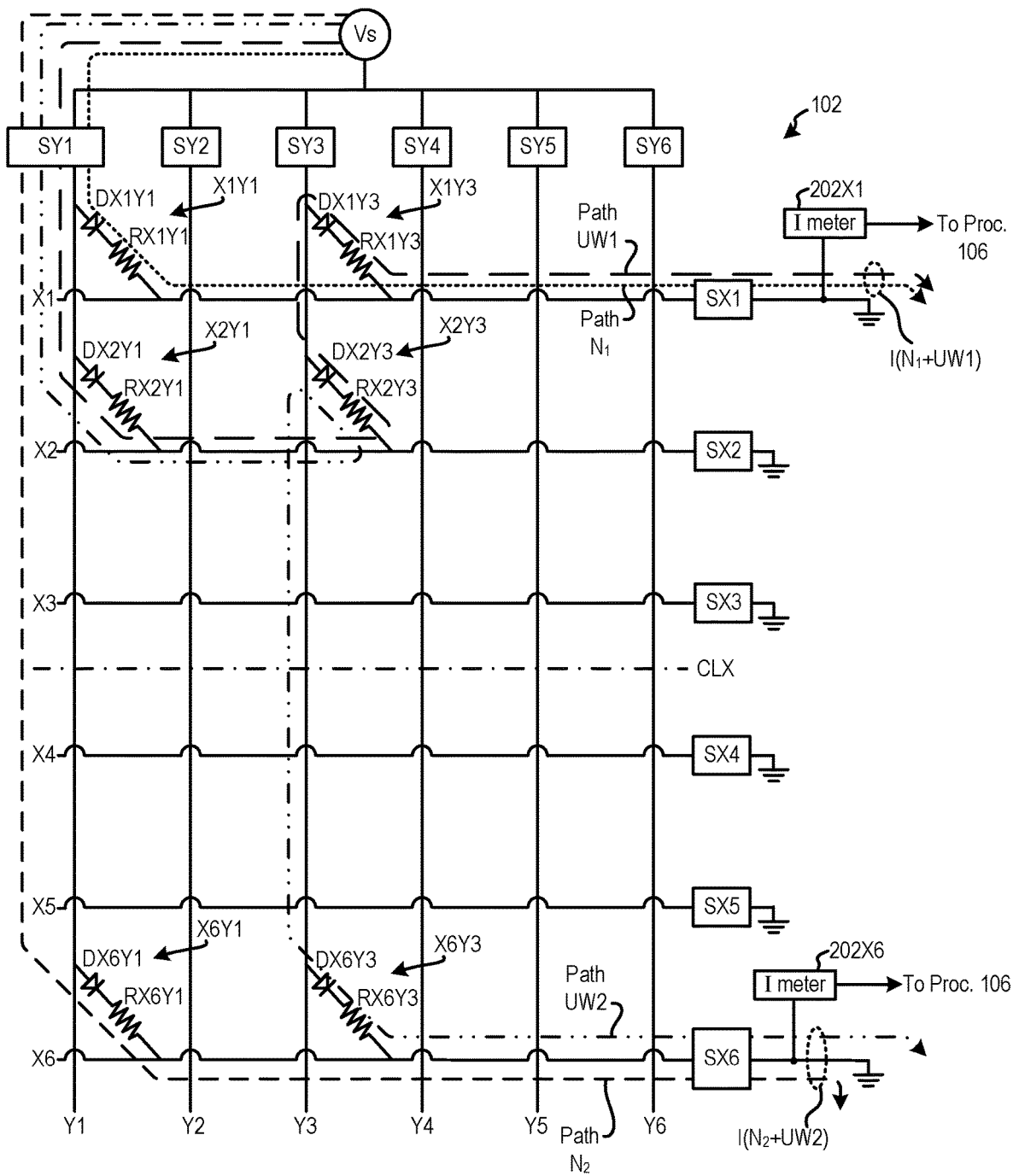

FIG. 2A-1 is a diagram of an embodiment of the heater array 102 with a failed heater diode at the location X2Y3 to illustrate symmetry between currents that are metered from the heaters at the locations of, at or along the X1 bus and the locations of the X6 bus. It should be noted that the bus X2 is associated with the faulty heater at the location X2Y3. For example, the faulty heater at the location X2Y3 is located on the bus X2. Similarly, the bus Y3 is associated with the faulty heater at the location X2Y3. For example, the faulty heater at the location X2Y3 is located on the bus Y3. An example of locations of or at or along a bus includes locations of heaters having terminals that are coupled to the bus. To illustrate, locations X1Y1, X1Y2, X1Y3, X1Y4, X1Y5, and X1Y6 are along the bus X1 and locations X1Y1, X2Y1, X3Y1, X4Y1, X5Y1, and X6Y1 are along the bus Y1. A terminal of a heater at the location X1Y1 is connected to the X1 bus, a terminal of a heater at the location X1Y2 is connected to the is connected to the X1 bus, a terminal of a heater at the location X1Y3 is connected to the X1 bus, a terminal of a heater at the location X1Y4 is connected to the X1 bus, a terminal of a heater at the location X1Y5 is connected to the X1 bus, and a terminal of a heater at the location X1Y6 is connected to the X1 bus.

The processor 106 of FIG. 1 sends a control signal, such as a duty cycle control signal, to the multiplexer 108 (FIG. 1) to close the switches SY1 and SX1 and to open the remaining switches SY2 through SY6 and SX2 through SX6. Upon receiving the control signal, the multiplexer 108 sends signals to the switches SY1 and SX1 to close the switches SY1 and SX1 and does not send signals to the switches SY2 through SY6 and SX2 through SX6 to open the switches SY2 through SY6 and SX2 through SX6.

When the switches SY1 and SX1 are closed, a normal current $IN_1$ flows from the voltage source Vs through a path $N_1$ to the ground potential. As an example, a normal current, as used herein, flows through a heater that has not failed. The path $N_1$ starts at the voltage source Vs and extends via the switch SY1, the bus Y1, the heater at the location X1Y1, the bus X1, and the switch SX1 to the ground potential. In addition, because the heater at the location X2Y3 has a fault, when the switches SY1 and SX1 are closed, an extraneous current IUW1 flows from the voltage source Vs via a path UW1 to the ground potential. It should be noted that the terms extraneous current, bonus current, unwanted (UW) current, and leakage current are used interchangeably herein. Moreover, a fault at a location of the heater is a result of a short in a diode at the location.

The path UW1 starts at the voltage source Vs and extends via the switch SY1, the bus Y1, the heater at the location X2Y1, the bus X2, the heater at the location X2Y3, the Y3 bus, the heater at the location X1Y3, the bus X1, and the switch SX1 to the ground potential. The current meter 202X1 measures a sum $I(N_1+UW1)$ of the normal current $IN_1$ and the extraneous current IUW1 at a terminal of the switch SX1. The current meter 202X1 is coupled to the terminal of the switch SX1 and the terminal is coupled to the ground potential. Examples of a current meter, as used herein, include a current sensor or a current measurement device that measures an amount of current passing through a bus.

Similarly, when the switches SY1 and SX6 are closed, a normal current $IN_2$ flows from the voltage source Vs through a path $N_2$ to the ground potential. The path $N_2$ starts at voltage source Vs and extends via the switch SY1, the bus Y1, the heater at the location X6Y1, the bus X6, and the switch SX6 to the ground potential. In addition, because the heater at the location X2Y3 has a fault, when the switches SY1 and SX6 are closed, an extraneous current IUW2 flows from the voltage source Vs via a path UW2 to the ground potential. The path UW2 starts at the voltage source Vs and extends via the switch SY1, the bus Y1, the heater at the location X2Y1, the bus X2, the heater at the location X2Y3, the Y3 bus, the heater at the location X6Y3, the bus X6, and the switch SX6 to the ground potential. The current meter 202X6 measures a sum $I(N_2+UW2)$ of the normal current $IN_2$ and the extraneous current IUW2 at a terminal of the switch SX6. The current meter 202X6 is coupled to the terminal of the switch SX6 and the terminal is coupled to the ground potential. As illustrated in FIG. 2A-1, any heater, such as the heaters at the locations X1Y1 and X6Y1, that is not on the same bus having the faulty heater at the location X2Y3 will have the extraneous current received from the voltage source Vs via the faulty heater. The bus having the faulty heater at the location X2Y3 is the bus X2 or the bus Y3.

Each current meter, described herein, is coupled to the processor 106. The processor 106 receives the measurements of the sums $I(N_1+UW1)$ and $I(N_2+UW2)$, and determines whether the sum $I(N_1+UW1)$ is symmetric with respect to the sum $I(N_2+UW2)$. For example, the processor 106 determines whether the sum $I(N_1+UW1)$ is within a pre-determined range from the sum $I(N_2+UW2)$. An example of measurements of current within the pre-determined range includes measurements that have a difference less than 0.2 amperes or less than 0.3 amperes. Upon determining that the measurement of the sum $I_{(N1)}+UW1)$ is within the pre-determined range from the measurement of the sum $I_{(N2)}+UW2)$, the processor 106 determines that the measurements are symmetric with respect to each other or that the heaters at the locations X1Y1 and X6Y1 are symmetric with respect to each other. On the other hand, in response to determining that the measurement of the sum $I_{(N1)}+UW1)$ is not within or outside the pre-determined range from the measurement of the sum $I_{(N2)}+UW2)$, the processor 106 determines that the measurements are asymmetric or that the heaters at the locations X1Y1 and X6Y1 are asymmetric with respect to each other. An example of measurements of current outside or not within the pre-determined range are measurements that have a difference greater than a pre-determined limit, such as greater than 1 ampere or greater than 0.5 amperes.

Similarly, the processor 106 controls the multiplexer 108 to further control the switches SY2 and SX1 to be closed while opening the remaining switches SX2 through SX6, SY1, and SY3 through SY6. The processor 106 receives a measurement of current from the current meter 202X1 when the switches SY2 and SX1 are closed and the remaining switches SX2 through SX6, SY1, and SY3 through SY6 are open. Also, the processor 106 controls the multiplexer 108 to further control the switches SY2 and SX6 to be closed while opening the remaining switches SX1 through SX5, SY1, and SY3 through SY6. The processor 106 receives a measurement of current from the current meter 202X6 when the switches SY2 and SX6 are closed and the remaining switches SX1 through SX5, SY1, and SY3 through SY6 are open. The processor 106 compares the measurements received from the current meters 202X1 and 202X6 to determine that the measurements or the heaters at the locations X1Y2 and X6Y2 are symmetric with respect to each other in the same manner as described above.

Furthermore, the processor 106 controls the switch SY4 and SX1 to be closed and the remaining switches SY1 through SY3, SY5, SY6, and SX2 through SX6 to be open to obtain a measurement of current from the current meter 202X1. The processor 106 further controls the switches SY4 and SX6 to be closed and the remaining switches SY1 through SY3, SY5, SY6, and SX1 through SX5 to be open to obtain a measurement of current from the current meter 202X6. The processor 106 compares the measurements received from the current meters 202X1 and 202X6 to determine that the measurements or the heaters at the locations X1Y4 and X6Y4 are symmetric with respect to each other in the same manner as described above.

Additionally, the processor 106 controls the switch SY5 and SX1 to be closed and the remaining switches SY1 through SY4, SY6, and SX2 through SX6 to be open to obtain a measurement of current from the current meter 202X1. The processor 106 controls the switches SY5 and SX6 to be closed and the remaining switches SY1 through SY4, SY6, and SX1 through SX5 to be open to obtain a measurement of current from the current meter 202X6. The processor 106 compares the measurements received from the current meters 202X1 and 202X6 to determine that the measurements or the heaters at the locations X1Y5 and X6Y5 are symmetric with respect to each other in the same manner as described above.

Moreover, the processor 106 controls the switch SY6 and SX1 to be closed and the remaining switches SY1 through SY5, and SX2 through SX6 to be open to obtain a measurement of current from the current meter 202X1. The processor 106 controls the switches SY6 and SX6 to be closed and the remaining switches SY1 through SY5 and SX1 through SX5 to be open to obtain a measurement of current from the current meter 202X6. The processor 106 compares the measurements received from the current meters 202X1 and 202X6 to determine that the measurements or the heaters at the locations X1Y6 and X6Y6 are symmetric with respect to each other in the same manner as described above. When the switches of the heater array 102 are controlled so that the current passes through the locations X1Y1 and X6Y1, the locations X1Y2 and X6Y2, the locations X1Y4 and X6Y4, the locations X1Y5 and X6Y5, and the locations X1Y6 and X6Y6, the processor 106 determines that the currents are symmetric between the locations X1Y1 and X6Y1, the locations X1Y2 and X6Y2, the locations X1Y4 and X6Y4, the locations X1Y5 and X6Y5, and the locations X1Y6 and X6Y6. As illustrated in FIG. 2A-1, any heaters, such as the heaters at the location X1Y1 and X6Y1, of the heater array 102 that are not on the same Y3 bus as the faulty heater at the location X2Y3 will have the extraneous current measurements from the extraneous current that flows from the voltage source Vs via the heater at the location X2Y3, but remain symmetric.

It should be noted that the buses X1 and X6 are symmetric, such as symmetrically located, with respect to the center x-axis CLX. For example, the bus X1 is separated from the center x-axis CLX by two buses X2 and X3 and the bus X6 is separated from the center x-axis CLX by the same number of buses, which are X4 and X5. Each of the X buses X1 through X6 are illustrated as running parallel to the center x-axis.

Figures 2, 2A:
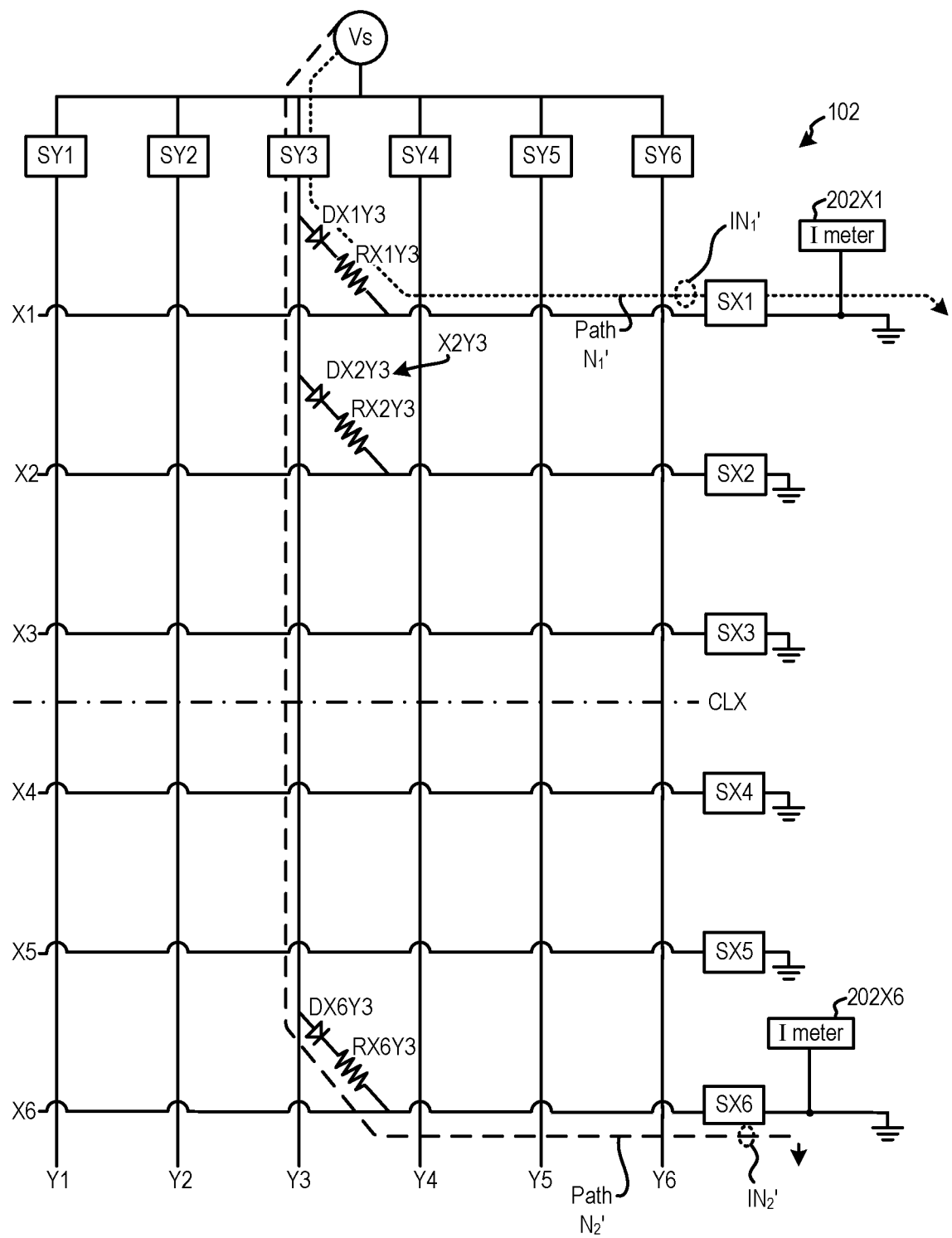

FIG. 2A-2 is a diagram of an embodiment to illustrate that currents are symmetric at the locations of the X1 bus and the locations of the X6 bus. The processor 106 of FIG. 1 sends a control signal to the multiplexer 108 (FIG. 1) to close the switches SY3 and SX1 and to open the remaining switches SY1, SY2, SY4 through SY6, and SX2 through SX6. Upon receiving the control signal, the multiplexer 108 sends signals to the switches SY3 and SX1 to close the switches SY3 and SX1 and does not send signals to the switches SY1, SY2, SY4 through SY6, and SX2 through SX6 to open the switches SY1, SY2, SY4 through SY6, and SX2 through SX6.

When the switches SY3 and SX1 are closed, a normal current $IN_1'$ flows from the voltage source Vs through a path $N_1'$ to the ground potential. The path $N_1'$ starts at voltage source Vs and extends via the switch SY3, the bus Y3, the heater at the location X1Y3, the bus X1, and the switch SX1 to the ground potential. The current meter 202X1 measures the normal current $IN_1'$ at the terminal of the switch SX1. An extraneous current does not pass through the bus X1 due to the fault in the heater at the location X2Y3 when the switches SY3 and SX1 are closed and the switches SY1, SY2, SY4 through SY6, and SX2 through SX6 are open.

Similarly, the processor 106 sends a control signal to the multiplexer 108 to close the switches SY3 and SX6 and to open the remaining switches SY1, SY2, SY4 through SY6, and SX1 through SX5. Upon receiving the control signal, the multiplexer 108 sends signals to the switches SY3 and SX6 to close the switches SY3 and SX6 and does not send signals to the switches SY1, SY2, SY4 through SY6, and SX1 through SX5 to open the switches SY1, SY2, SY4 through SY6, and SX1 through SX5.

When the switches SY3 and SX6 are closed, a normal current $IN_2'$ flows from the voltage source Vs through a path $N_2'$ to the ground potential. The path $N_2'$ starts at voltage source Vs and extends via the switch SY3, the bus Y3, the heater at the location X6Y3, the bus X6, and the switch SX6 to the ground potential. The current meter 202X6 measures the normal current $IN_2'$ at the terminal of the switch SX6. An extraneous current does not pass through the bus X6 due to the fault in the heater at the location X2Y3 when the switches SY3 and SX6 are closed and the switches SY1, SY2, SY4 through SY6, and SX1 through SX5 are open.

The processor 106 receives and compares the measurements of the currents $IN_1'$ and $IN_2'$ and determines that the measurements are symmetric with respect to each other or that the heaters at the locations X1Y3 and X6Y3 are symmetric with respect to each other. For example, the processor 106 determines that the measurement of the current $IN_1'$ is within the pre-determined range from the measurement of the current $IN_2'$. As illustrated in FIG. 2A-2, any heater, such as the heater at the location X1Y3 and the heater at the location X6Y3, that is on the same Y3 bus as the faulty heater at the location X2Y3 will not have the extraneous current that flows from the voltage source Vs via the heater at the location X2Y3, but remains symmetric. With reference to FIGS. 2A-1 and 2A-2, the processor 106 determines that the currents are symmetric between all locations of heaters along the X1 and X6 buses.

Moreover, in a similar manner in which all the locations of or along the X1 and X6 buses are determined to be symmetric by the processor 106, all locations of or along the X3 and X4 buses are determined to be symmetric by the processor 106. For example, the processor 106 determines that the currents between the locations X3Y1 and X4Y1 are symmetric, that the currents between the locations X3Y2 and X4Y2 are symmetric, that the currents between the locations X3Y3 and X4Y3 are symmetric, that the currents between the locations X3Y4 and X4Y4 are symmetric, that the currents between the locations X3Y5 and X4Y5 are symmetric, and that the currents between the locations X3Y6 and X4Y6 are symmetric.

Figures 1, 2B:
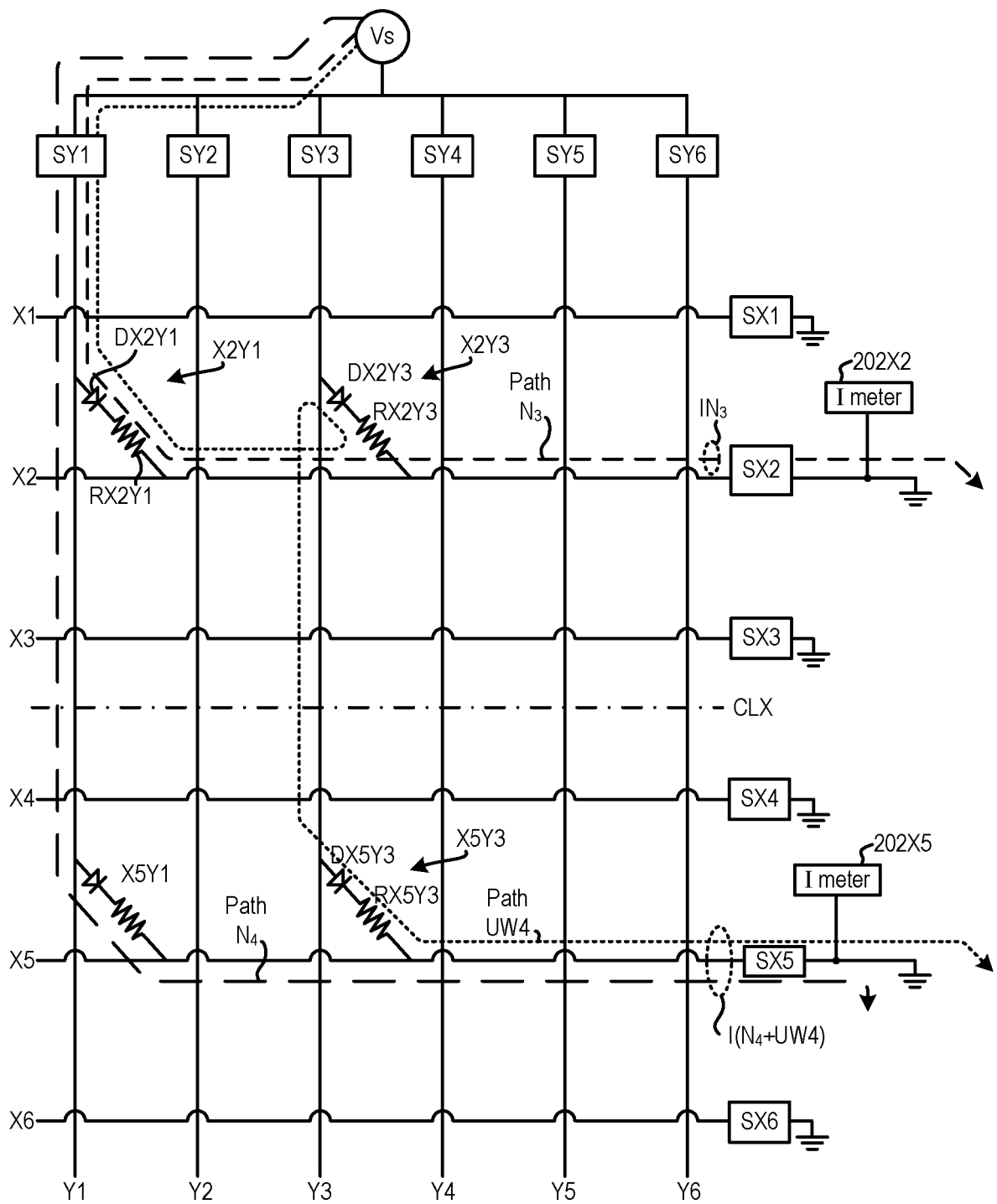
Figures 2, 2B:
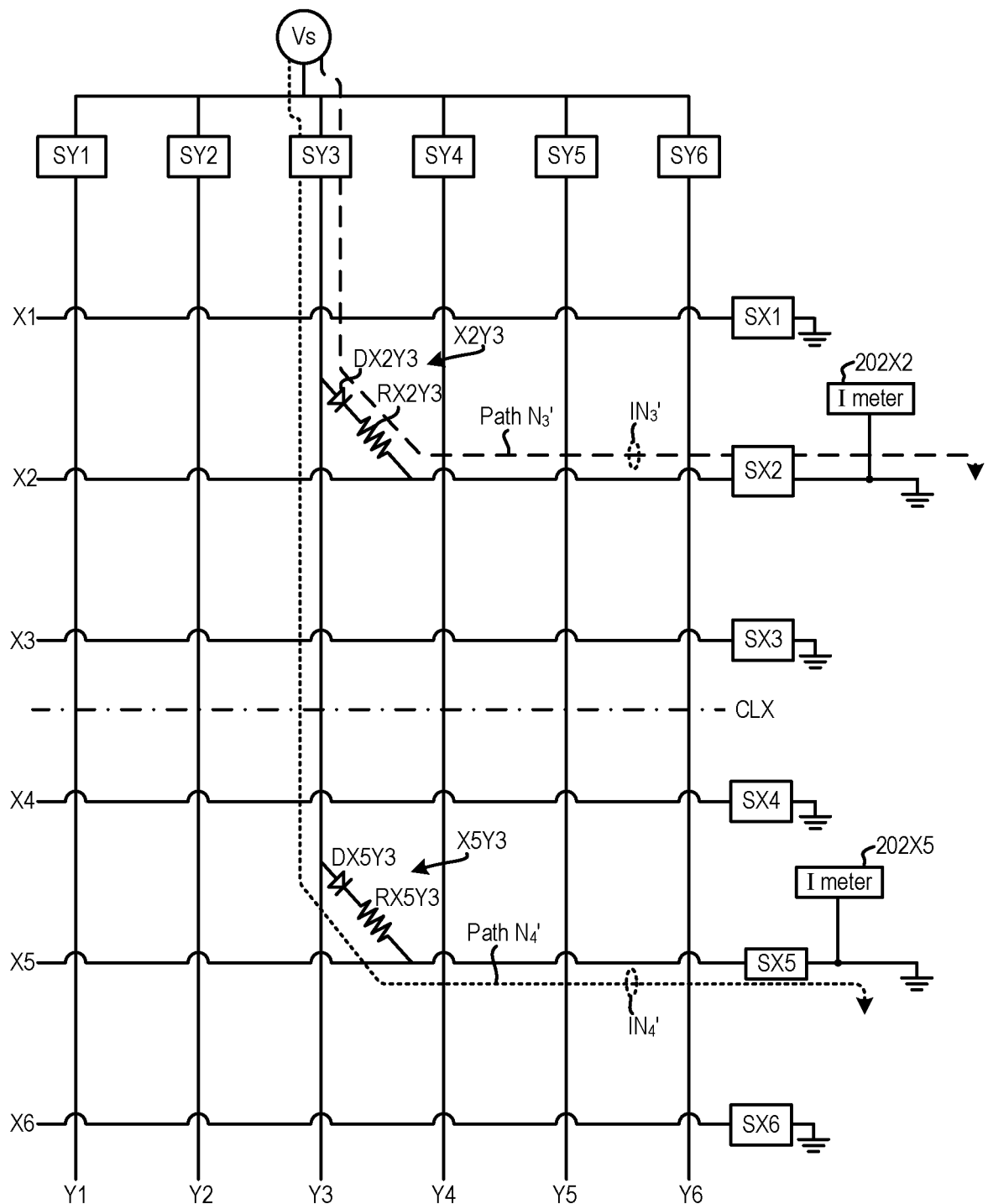

FIG. 2B-1 is a diagram of an embodiment of the heater array 102 to illustrate asymmetry between currents that are metered from the heaters at all locations along the X2 bus except for one location along the X2 bus and at all locations of the X5 bus except for one location along the X5 bus. The processor 106 of FIG. 1 sends a control signal to the multiplexer 108 (FIG. 1) to close the switches SY1 and SX2 and to open the remaining switches SY2 through SY6, SX1, and SX3 through SX6. Upon receiving the control signal, the multiplexer 108 sends signals to the switches SY1 and SX2 to close the switches SY1 and SX2 and does not send signals to the switches SY2 through SY6, SX1, and SX3 through SX6 to open the switches SY2 through SY6, SX1, and SX3 through SX6.

When the switches SY1 and SX2 are closed and the remaining switches SY2 through SY6, SX1, and SX3 through SX6 are open, a normal current $IN_3$ flows from the voltage source Vs through a path $N_3$ to the ground potential. The path $N_3$ starts at voltage source Vs and extends via the switch SY1, the bus Y1, the heater at the location X2Y1, the bus X2, and the switch SX2 to the ground potential. The current meter 202X2 measures the current $IN_3$ at a terminal of the switch SX2. The current meter 202X2 is coupled to the terminal of the switch SX2 that is coupled to the ground potential.

Similarly, when the switches SY1 and SX5 are closed and remaining switches SY2 through SY6, SX1 through SX4, and SX6 are open, a normal current $IN_4$ flows from the voltage source Vs through a path $N_4$ to the ground potential. The path $N_4$ starts at voltage source Vs and extends via the switch SY1, the bus Y1, the heater at the location X5Y1, the bus X5, and the switch SX5 to the ground potential. In addition, because the heater at the location X2Y3 has a fault, when the switches SY1 and SX5 are closed, an extraneous current IUW4 flows from the voltage source Vs via a path UW4 to the ground potential. The path UW4 starts at the voltage source Vs and extends via the switch SY1, the bus Y1, the heater at the location X2Y1, the bus X2, the heater at the location X2Y3, the Y3 bus, the heater at the location X5Y3, the bus X5, and the switch SX5 to the ground potential. The current meter 202X5 measures a sum $I(N_4+UW4)$ of the normal current $IN_4$ and the extraneous current IUW4 at a terminal of the switch SX5. The current meter 202X5 is coupled to the terminal of the switch SX5 and the terminal is coupled to the ground potential.

It should be noted that the currents $IN_3$ and $IN_4$ are nearly identical due to fabrication or design of the heater array 102. The processor 106 receives the measurements of the currents $IN_3$ and $I(N_4+UW4)$, and determines that the measurements are asymmetric or that the heaters at the locations X2Y1 and X5Y1 are asymmetric with respect to each other. For example, the processor 106 determines that the measurement of the current $IN_3$ is outside the pre-determined range from the measurement of the current $I(N_4+UW4)$.

Similarly, the processor 106 controls the multiplexer 108 to further control the switches SY2 and SX2 to be closed while opening the remaining switches SX1, SX3 through SX6, SY1, and SY3 through SY6. The processor 106 receives a measurement of current from the current meter 202X2 when the switches SY2 and SX2 are closed and the remaining switches SX1, SX3 through SX6, SY1, and SY3 through SY6 are open. Also, the processor 106 controls the multiplexer 108 to further control the switches SY2 and SX5 to be closed while opening the remaining switches SX1 through SX4, SX6, SY1, and SY3 through SY6. The processor 106 receives a measurement of current from a current meter 202X5 when the switches SY2 and SX5 are closed and the remaining switches SX1 through SX4, SX6, SY1, and SY3 through SY6 are open. The processor 106 compares the measurements received from the current meters 202X2 and 202X5 to determine that the measurements of currents or the heaters at the locations X2Y2 and X5Y2 are asymmetric with respect to each other in the same manner as described above.

Furthermore, the processor 106 controls the switch SY4 and SX2 to be closed and the remaining switches SY1 through SY3, SY5, SY6, SX1, and SX3 through SX6 to be open to obtain a measurement of current from the current meter 202X2. The processor 106 further controls the switches SY4 and SX5 to be closed and the remaining switches SY1 through SY3, SY5, SY6, SX1 through SX4, and SX6 to be open to obtain a measurement of current from the current meter 202X5. The processor 106 compares the measurements received from the current meters 202X2 and 202X4 to determine that measurements of currents or the heaters at the locations X2Y4 and X5Y4 are asymmetric with respect to each other in the same manner as described above.

Additionally, the processor 106 controls the switch SY5 and SX2 to be closed and the remaining switches SY1 through SY4, SY6, SX1, and SX3 through SX6 to be open to obtain a measurement of current from the current meter 202X2. The processor 106 controls the switches SY5 and SX5 to be closed and the remaining switches SY1 through SY4, SY6, SX1 through SX4, and SX6 to be open to obtain a measurement of current from the current meter 202X5. The processor 106 compares the measurements received from the current meters 202X2 and 202X5 to determine that the measurements of currents or the heaters at the locations X2Y5 and X5Y5 are asymmetric with respect to each other in the same manner as described above.

Moreover, the processor 106 controls the switch SY6 and SX2 to be closed and the remaining switches SY1 through SY5, SX1, and SX3 through SX6 to be open to obtain a measurement of current from the current meter 202X2. The processor 106 controls the switches SY6 and SX5 to be closed and the remaining switches SY1 through SY5, SX1 through SX4, and SX6 to be open to obtain a measurement of current from the current meter 202X5. The processor 106 compares the measurements received from the current meters 202X2 and 202X5 to determine that the measurements or the heaters at the locations X2Y6 and X5Y6 are asymmetric with respect to each other in the same manner as described above. In this manner, when the switches of the heater array 102 are controlled so that the current passes through the locations X2Y1 and X5Y1, the locations X2Y2 and X5Y2, the locations X2Y4 and X5Y4, the locations X2Y5 and X5Y5, and the locations X2Y6 and X5Y6 in a consecutive manner, the processor 106 determines that the currents are asymmetric between the locations X2Y1 and X5Y1, the locations X2Y2 and X5Y2, the locations X2Y4 and X5Y4, the locations X2Y5 and X5Y5, and the locations X2Y6 and X5Y6.

It should be noted that the buses X2 and X5 are symmetric, such as symmetrically located and symmetrically fabricated, with respect to the center x-axis CLX. For example, the bus X2 is separated from the center x-axis CLX by one bus X3 and the bus X5 is separated from the center x-axis CLX via one bus X4.

FIG. 2B-2 is a diagram of an embodiment to illustrate that currents are symmetric at the locations X2Y3 and X5Y3. The processor 106 of FIG. 1 sends a control signal to the multiplexer 108 (FIG. 1) to close the switches SY3 and SX2 and to open the remaining switches SY1, SY2, SY4 through SY6, SX1, and SX3 through SX6. Upon receiving the control signal, the multiplexer 108 sends signals to the switches SY3 and SX2 to close the switches SY3 and SX2 and does not send signals to the switches SY1, SY2, SY4 through SY6, SX1, and SX4 through SX6 to open the switches SY1, SY2, SY4 through SY6, SX1, and SX4 through SX6.

When the switches SY3 and SX2 are closed, a normal current $IN_3'$ flows from the voltage source Vs through a path $N_3'$ to the ground potential. The path $N_3'$ starts at voltage source Vs and extends via the switch SY3, the bus Y3, the heater at the location X2Y3, the bus X2, and the switch SX2 to the ground potential. The current meter 202X2 measures the normal current $IN_3'$ at the terminal of the switch SX2.

Similarly, the processor 106 sends a control signal to the multiplexer 108 to close the switches SY3 and SX5 and to open the remaining switches SY1, SY2, SY4 through SY6, SX1 through SX4, and SX6. Upon receiving the control signal, the multiplexer 108 sends signals to the switches SY3 and SX5 to close the switches SY3 and SX5 and does not send signals to the switches SY1, SY2, SY4 through SY6, SX1 through SX4, and SX6 to open the switches SY1, SY2, SY4 through SY6, SX1 through SX4, and SX6.

When the switches SY3 and SX5 are closed, a normal current $IN_4'$ flows from the voltage source Vs through a path $N_4'$ to the ground potential. The path $N_4'$ starts at voltage source Vs and extends via the switch SY3, the bus Y3, the heater at the location X5Y3, the bus X5, and the switch SX5 to the ground potential. The current meter 202X5 measures the normal current $IN_4'$ at the terminal of the switch SX5.

The processor 106 receives the measurements of the currents $IN_3'$ and $IN_4'$, and determines that the measurement of the current $IN_3'$ is symmetric with respect to the measurement of the current $IN_4'$ or that the heaters at the locations X2Y3 and X5Y3 are asymmetric with respect to each other. For example, the processor 106 determines that the measurement of the current $IN_3'$ is within the predetermined range from the measurement of the current $IN_4'$.

As illustrated in FIG. 2B-2, the processor 106 determines that the currents are symmetric between the locations X2Y3 and X5Y3. Also, as illustrated in FIG. 2B-1, the processor 106 determines that the currents are asymmetric between at least one of the locations of heaters along the X2 and X5 buses to identify the X2 and X5 buses from all the buses X1 through X6 of the heater array 102. The locations for which the current are asymmetric along the X2 and X5 buses include the locations X2Y1 and X5Y1, X2Y2 and X5Y2, X2Y4 and X5Y4, X2Y5 and X5Y5, and X2Y6 and X5Y6. The currents received from the locations X2Y3 and X5Y3 are symmetric.

Figures 1, 3A:
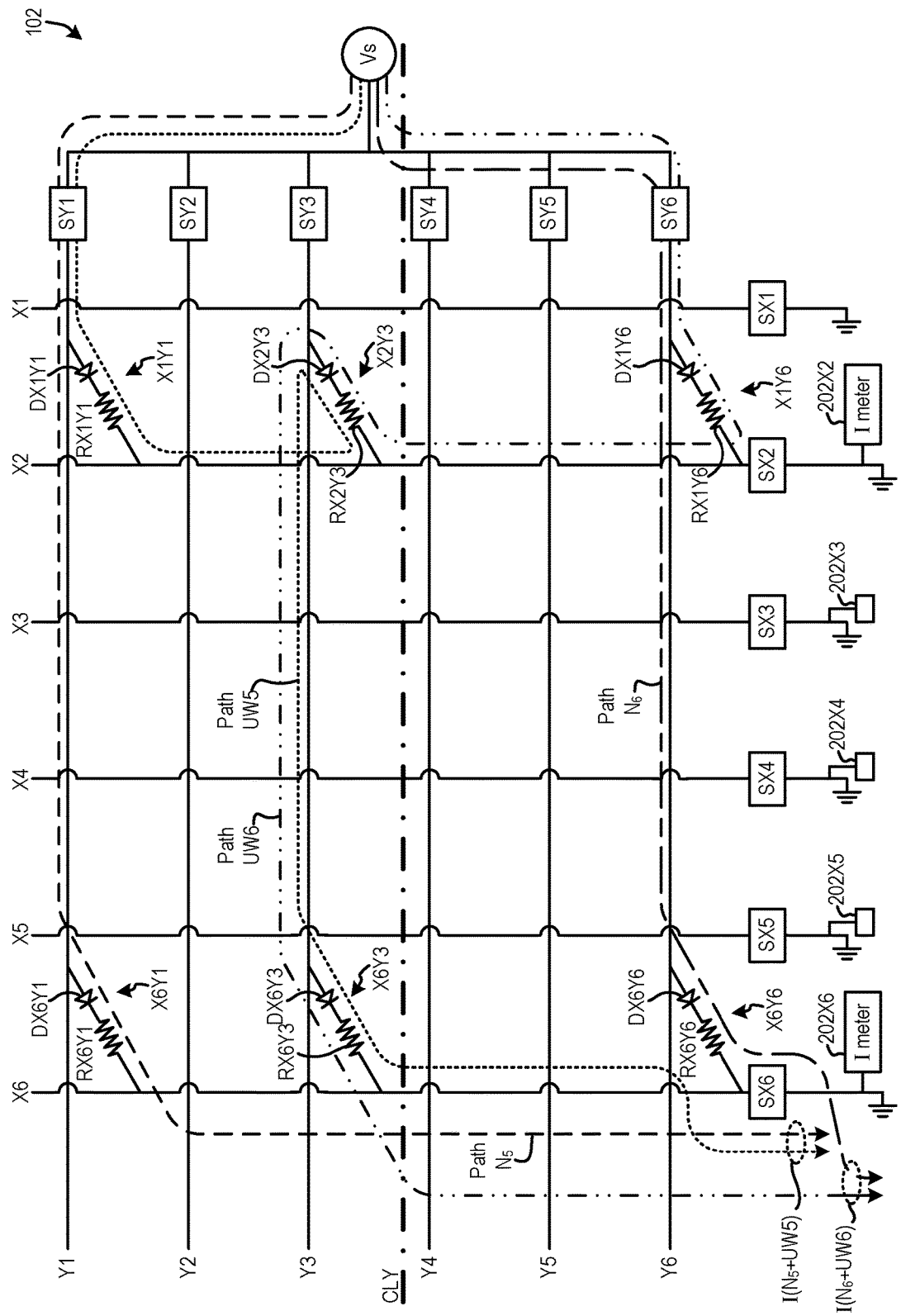
Figures 2, 3A:
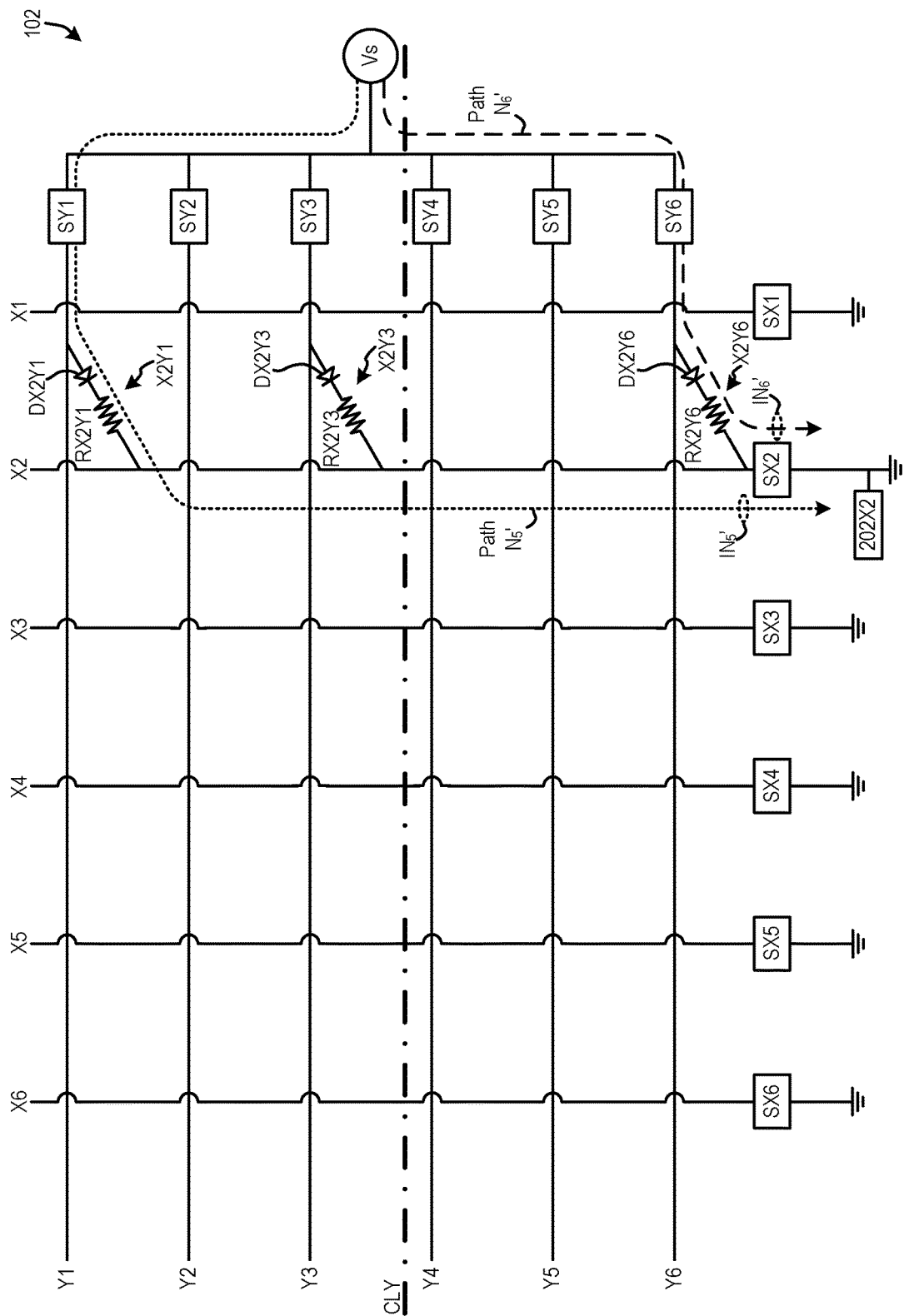

FIG. 3A-1 is a diagram of an embodiment of the heater array 102 to illustrate symmetry between currents that are metered from the heaters at the locations of the Y1 bus and the locations of the Y6 bus. The processor 106 of FIG. 1 sends a control signal to the multiplexer 108 (FIG. 1) to close the switches SY1 and SX6 and to open the remaining switches SY2 through SY6 and SX1 through SX5. Upon receiving the control signal, the multiplexer 108 sends signals to the switches SY1 and SX6 to close the switches SY1 and SX6 and does not send signals to the switches SY2 through SY6 and SX1 through SX5 to open the switches SY2 through SY6 and SX1 through SX5.

When the switches SY1 and SX6 are closed, a normal current $IN_5$ flows from the voltage source Vs through a path $N_5$ to the ground potential. The path $N_5$ starts at voltage source Vs and extends via the switch SY1, the bus Y1, the heater at the location X6Y1, the bus X6, and the switch SX6 to the ground potential. In addition, because the heater at the location X2Y3 has a fault, when the switches SY1 and SX6 are closed, an extraneous current IUW5 flows from the voltage source Vs via a path UW5 to the ground potential. The path UW5 starts at the voltage source Vs and extends via the switch SY1, the bus Y1, the heater at the location X1Y1, the bus X2, the heater at the location X2Y3, the Y3 bus, the heater at the location X6Y3, the bus X6, and the switch SX6 to the ground potential. The current meter 202X6 measures a sum $I(N_5+UW5)$ of the normal current $IN_5$ and the extraneous current IUW5 at a terminal of the switch SX5. The current meter 202X6 is coupled to the terminal of the switch SX6 and the terminal is coupled to the ground potential.

Similarly, when the switches SY6 and SX6 are closed, a normal current $IN_6$ flows from the voltage source Vs through a path $N_6$ to the ground potential. The path $N_6$ starts at voltage source Vs and extends via the switch SY6, the bus Y6, the heater at the location X6Y6, the bus X6, and the switch SX6 to the ground potential. In addition, because the heater at the location X2Y3 has a fault, when the switches SY6 and SX6 are closed, an extraneous current IUW6 flows from the voltage source Vs via a path UW6 to the ground potential. The path UW6 starts at the voltage source Vs and extends via the switch SY6, the bus Y6, the heater at the location X1Y6, the bus X2, the heater at the location X2Y3, the Y3 bus, the heater at the location X6Y3, the bus X6, and the switch SX6 to the ground potential. The current meter 202X6 measures a sum $I(N_6+UW6)$ of the normal current $IN_6$ and the extraneous current IUW6 at a terminal of the switch SX6.

It should be noted that the currents $I(N_5)$ and $I(N_6)$ are approximately the same due to the fabrication of the heater array 102 and so are the currents $I(UW_5)$ and $I(UW_6)$. The processor 106 receives the measurements of the sums $I(N_5+UW5)$ and $I(N_6+UW6)$, and determines that the measurement of the sum $I(N_6+UW6)$ is symmetric with respect to the measurement of the sum $I(N_5+UW5)$ to further determine that the heaters at the locations X6Y1 and X6Y6 are symmetric with respect to each other. For example, the processor 106 determines that the measurement of the sum $I(N_5+UW5)$ is within a pre-set range from the measurement of the sum $I(N_6+UW6)$.

Similarly, the processor 106 controls the multiplexer 108 to further control the switches SY1 and SX5 to be closed while opening the remaining switches SX1 through SX4, SX6, and SY2 through SY6. The processor 106 receives a measurement of current from the current meter 202X5 when the switches SY1 and SX5 are closed and the remaining switches SX1 through SX4, SX6, and SY2 through SY6 are open. Also, the processor 106 controls the multiplexer 108 to further control the switches SY6 and SX5 to be closed while opening the remaining switches SX1 through SX4, SX6, and SY1 through SY5. The processor 106 receives a measurement of current from the current meter 202X5 when the switches SY6 and SX5 are closed and the remaining switches SX1 through SX4, SX6, and SY1 through SY5 are open. The processor 106 compares the measurements received from the current meter 202X5 to determine that the measurements or the heaters at the locations X5Y1 and X5Y6 are symmetric with respect to each other in the same manner as described above.

Furthermore, the processor 106 controls the switch SY1 and SX4 to be closed and the remaining switches SY2 through SY6, SX1 through SX3, SX5, and SX6 to be open to obtain a measurement of current from the current meter 202X4. The processor 106 further controls the switches SY6 and SX4 to be closed and the remaining switches SY1 through SY5, SX1 through SX3, SX5, and SX6 to be open to obtain a measurement of current from the current meter 202X4. The processor 106 compares the measurements received from the current meter 202X4 to determine that measurements or the heaters at the locations X4Y1 and X4Y6 are symmetric with respect to each other in the same manner as described above.

Additionally, the processor 106 controls the switch SY1 and SX3 to be closed and the remaining switches SY2 through SY6, SX1, SX2, and SX4 through SX6 to be open to obtain a measurement of current from the current meter 202X3. The processor 106 controls the switches SY6 and SX3 to be closed and the remaining switches SY1 through SY5, SX1, SX2, and SX4 through SX6 to be open to obtain a measurement of current from the current meter 202X3. The processor 106 compares the measurements received from the current meter 202X3 to determine that the measurements or the heaters at the locations X3Y1 and X3Y6 are symmetric with respect to each other in the same manner as described above.

Moreover, the processor 106 controls the switch SY1 and SX1 to be closed and the remaining switches SY2 through SY6, and SX2 through SX6 to be open to obtain a measurement of current from the current meter 202X1. The processor 106 controls the switches SY6 and SX1 to be closed and the remaining switches SY1 through SY5 and SX2 through SX6 to be open to obtain a measurement of current from the current meter 202X1. The processor 106 compares the measurements received from the current meter 202X1 to determine that the measurements or the heaters at the locations X1Y1 and X1Y6 are symmetric with respect to each other in the same manner as described above. When the switches of the heater array 102 are controlled so that the current passes through the locations X1Y1 and X1Y6, the locations X3Y1 and X3Y6, the locations X4Y1 and X4Y6, the locations X5Y1 and X5Y6, and the locations X6Y1 and X6Y6, the processor 106 determines that the currents are symmetric between the locations X1Y1 and X1Y6, the locations X3Y1 and X3Y6, the locations X4Y1 and X4Y6, the locations X5Y1 and X5Y6, and the locations X6Y1 and X6Y6.

It should be noted that the buses Y1 and Y6 are symmetric, such as symmetrically located and symmetrically fabricated, with respect to the center y-axis CLY. For example, the bus Y1 is separated from the center y-axis CLY by two buses Y2 and Y3 and the bus Y6 is separated from the center y-axis CLY by the same number of two buses, which are Y4 and Y5. The Y buses Y1 through Y6 are illustrated as running parallel to the center y-axis.

FIG. 3A-2 is a diagram of an embodiment to illustrate that currents are symmetric at the locations X2Y1 and X2Y6. The processor 106 of FIG. 1 sends a control signal to the multiplexer 108 (FIG. 1) to close the switches SY1 and SX2 and to open the remaining switches SY2 through SY6, SX1, and SX3 through SX6. Upon receiving the control signal, the multiplexer 108 sends signals to the switches SY1 and SX2 to close the switches SY1 and SX2 and does not send signals to the switches SY2 through SY6, SX1, and SX3 through SX6 to open the switches SY2 through SY6, SX1, and SX3 through SX6.

When the switches SY1 and SX2 are closed, a normal current $IN_5'$ flows from the voltage source Vs through a path $N_5'$ to the ground potential. The path $N_5'$ starts at voltage source Vs and extends via the switch SY1, the bus Y1, the heater at the location X2Y1, the bus X2, and the switch SX2 to the ground potential. The current meter 202X2 measures the normal current $IN_5'$ at the terminal of the switch SX2. An extraneous current does not pass through the bus X2 due to the fault in the heater at the location X2Y3 when the switches SY1 and SX2 are closed and the switches SY2 through SY6, SX1, and SX3 through SX6 are open.

Similarly, the processor 106 sends a control signal to the multiplexer 108 to close the switches SY6 and SX2 and to open the remaining switches SY1 through SY5, SX1, and SX3 through SX6. Upon receiving the control signal, the multiplexer 108 sends signals to the switches SY6 and SX2 to close the switches SY6 and SX2 and does not send signals to the switches SY1 through SY5, SX1, and SX3 through SX6 to open the switches SY1 through SY5, SX1, and SX3 through SX6.

When the switches SY6 and SX2 are closed, a normal current $IN_6'$ flows from the voltage source Vs through a path $N_6'$ to the ground potential. The path $N_6'$ starts at the voltage source Vs and extends via the switch SY6, the bus Y6, the heater at the location X2Y6, the bus X2, and the switch SX2 to the ground potential. The current meter 202X2 measures the normal current $IN_6'$ at the terminal of the switch SX2. An extraneous current does not pass through the bus X2 due to the fault in the heater at the location X2Y3 when the switches SY6 and SX2 are closed and the switches SY1 through SY5, SX1, and SX3 through SX6 are open.

It should be note that $IN_5'$ and $IN_6'$ are approximately equal or approximately the same due to the fabrication of the heater array 102. The processor 106 receives the measurements of the currents $IN_5'$ and $IN_6'$, and determines that the currents are symmetric between the locations X2Y1 and X2Y6. For example, the processor 106 determines that the measurement of the current $IN_5'$ is within the pre-set range from the measurement of the current $IN_6'$. With reference to FIGS. 3A-1 and 3A-2, the processor 106 determines that the currents are symmetric between all locations of heaters along the Y1 and Y6 axes.

Moreover, in a similar manner in which all the locations along the Y1 and Y6 buses are determined to be symmetric by the processor 106, all locations along the Y2 and Y5 buses are determined to be symmetric by the processor 106. For example, the processor 106 determines that the currents between the locations X1Y2 and X1Y5 are symmetric, that the currents between the locations X2Y2 and X2Y5 are symmetric, that the currents between the locations X3Y2 and X3Y5 are symmetric, that the currents between the locations X4Y2 and X4Y5 are symmetric, that the currents between the locations X5Y2 and X5Y5 are symmetric, and that the currents between the locations X6Y2 and X6Y5 are symmetric.

Figures 1, 3B:
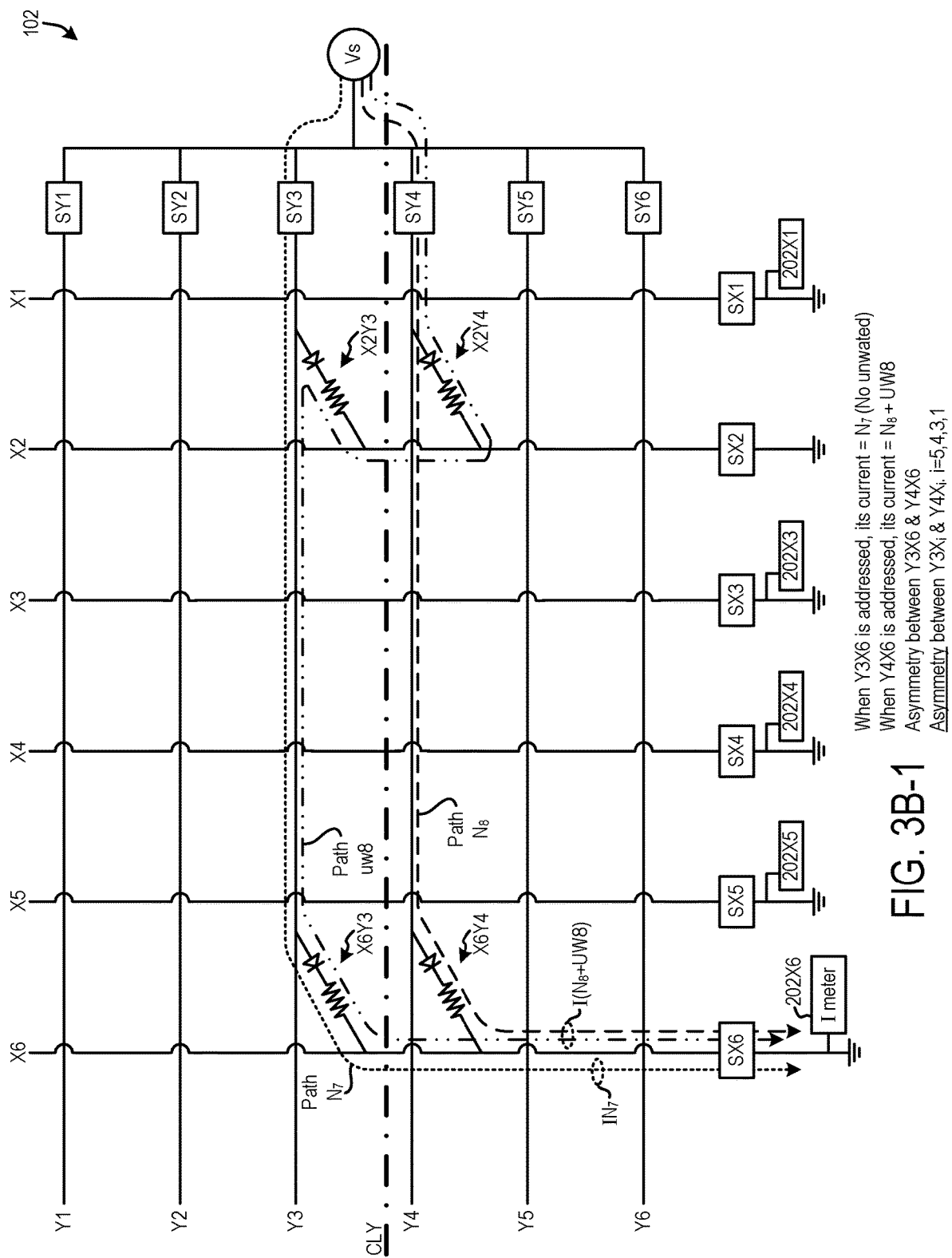
Figures 2, 3B:
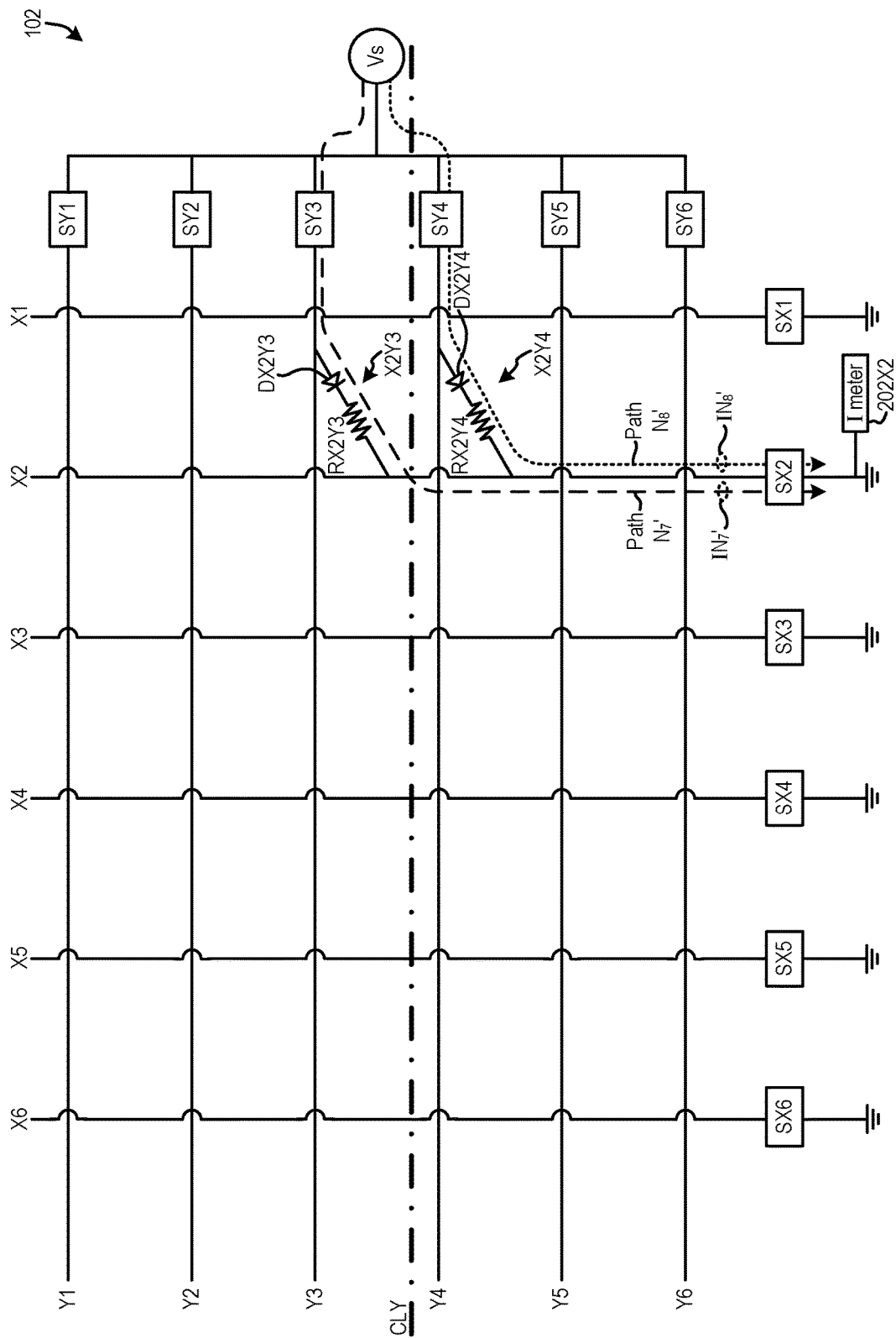

FIG. 3B-1 is a diagram of an embodiment of the heater array 102 to illustrate asymmetry between currents that are metered from the heaters at all locations of the Y3 bus except for one location along the Y3 bus and at all locations of the Y4 bus except for one location along the Y4 bus. The processor 106 of FIG. 1 sends a control signal to the multiplexer 108 (FIG. 1) to close the switches SY3 and SX6 and to open the remaining switches SY1, SY2, and SY4 through SY6, and SX1 through SX5. Upon receiving the control signal, the multiplexer 108 sends signals to the switches SY3 and SX6 to close the switches SY3 and SX6 and does not send signals to the remaining switches SY1, SY2, and SY4 through SY6, and SX1 through SX5 to open the remaining switches SY1, SY2, and SY4 through SY6, and SX1 through SX5.

When the switches SY3 and SX6 are closed and the remaining switches SY1, SY2, and SY4 through SY6, and SX1 through SX5 are open, a normal current $IN_7$ flows from the voltage source Vs through a path $N_7$ to the ground potential. The path $N_7$ starts at voltage source Vs and extends via the switch SY3, the bus Y3, the heater at the location X6Y3, the bus X6, and the switch SX6 to the ground potential. The current meter 202X6 measures the normal current $IN_7$ at the terminal of the switch SX6. It should be noted that no unwanted current flows through the switch SX6 as measured by the current meter 202X6.

Similarly, when the switches SY4 and SX6 are closed and the remaining switches SY1 through SY3, SY5, SY6, and SX1 through SX5 are open, a normal current $IN_8$ flows from the voltage source Vs through a path $N_8$ to the ground potential. The path $N_8$ starts at voltage source Vs and extends via the switch SY4, the bus Y4, the heater at the location X6Y4, the bus X6, and the switch SX6 to the ground potential. In addition, because the heater at the location X2Y3 has a fault, when the switches SY4 and SX6 are closed, an extraneous current IUW8 flows from the voltage source Vs via a path UW8 to the ground potential. The path UW8 starts at the voltage source Vs and extends via the switch SY4, the bus Y4, the heater at the location X2Y4, the bus X2, the heater at the location X2Y3, the Y3 bus, the heater at the location X6Y3, the bus X6, and the switch SX6 to the ground potential. The current meter 202X6 measures a sum $I(N_8+UW8)$ of the normal current $IN_8$ and the extraneous current IUW8 at the terminal of the switch SX6.

It should be noted that the current $IN_7$ and $IN_8$ are approximately equal due to the fabrication of the heater array 102. The processor 106 receives the measurements of the currents $IN_7$ and $I(N_8+UW8)$, and determines that the measurements are asymmetric or that the heaters at the locations X6Y3 and X6Y4 are asymmetric with respect to each other. For example, the processor 106 determines that the measurement of the current $IN_7$ is not within or outside the pre-set range from the measurement of the current $I(N_8+UW8)$.

Similarly, the processor 106 controls the multiplexer 108 to further control the switches SY3 and SX5 to be closed while opening the remaining switches SX1 through SX4, SX6, SY1, SY2, and SY4 through SY6. The processor 106 receives a measurement of current from the current meter 202X5 when the switches SY3 and SX5 are closed and the remaining switches SX1 through SX4, SX6, SY1, SY2, and SY4 through SY6 are open. Also, the processor 106 controls the multiplexer 108 to further control the switches SY4 and SX5 to be closed while opening the remaining switches SY1 through SY3, SY5, SY6, SX1 through SX4, and SX6. The processor 106 receives a measurement of current from a current meter 202X5 when the switches SY4 and SX5 are closed and the remaining switches SY1 through SY3, SY5, SY6, SX1 through SX4, and SX6 are open. The processor 106 compares the measurements received from the current meter 202X5 to determine that the measurements of currents or the heaters at the locations X5Y3 and X5Y4 are asymmetric with respect to each other in the same manner as described above.

Furthermore, the processor 106 controls the switch SY3 and SX4 to be closed and the remaining switches SY1, SY2, SY4 through SY6, SX1 through SX3, SX5 and SX6 to be open to obtain a measurement of current from the current meter 202X4. The processor 106 further controls the switches SY4 and SX4 to be closed and the remaining switches SY1 through SY3, SY5, SY6, SX1 through SX3, SX5 and SX6 to be open to obtain a measurement of current from the current meter 202X4. The processor 106 compares the measurements received from the current meters 202X4 to determine that measurements of currents or the heaters at the locations X4Y3 and X4Y4 are asymmetric with respect to each other in the same manner as described above.

Additionally, the processor 106 controls the switches SY3 and SX3 to be closed and the remaining switches SY1, SY2, and SY4 through SY6, SX1, SX2, and SX4 through SX6 to be open to obtain a measurement of current from the current meter 202X3. The processor 106 controls the switches SY4 and SX3 to be closed and the remaining switches SY1 through SY3, SY5, SY6, SX1, SX2, and SX4 through SX6 to be open to obtain a measurement of current from the current meter 202X3. The processor 106 compares the measurements received from the current meters 202X3 to determine that the measurements of currents from the heaters at the locations X3Y3 and X3Y4 are asymmetric with respect to each other in the same manner as described above.

Moreover, the processor 106 controls the switch SY3 and SX1 to be closed and the remaining switches SY1, SY2, SY4 through SY6, and SX2 through SX6 to be open to obtain a measurement of current from the current meter 202X1. The processor 106 controls the switches SY4 and SX1 to be closed and the remaining switches SY1 through SY3, SY5, SY6, and SX2 through SX6 to be open to obtain a measurement of current from the current meter 202X1. The processor 106 compares the measurements received from the current meter 202X1 to determine that the measurements or the heaters at the locations X1Y3 and X1Y4 are asymmetric with respect to each other in the same manner as described above. When the switches of the heater array 102 are controlled so that the current passes through the locations X6Y3 and X6Y4, the locations X5Y3 and X5Y4, the locations X4Y3 and X4Y4, the locations X3Y3 and X3Y4, and the locations X1Y3 and X1Y4, the processor 106 determines that the currents are asymmetric between the locations X6Y3 and X6Y4, the locations X5Y3 and X5Y4, the locations X4Y3 and X4Y4, the locations X3Y3 and X3Y4, and the locations X1Y3 and X1Y4.

It should be noted that the buses Y3 and Y4 are symmetric, such as symmetrically located, with respect to the center y-axis CLY. For example, the bus Y3 is the first bus from the center y-axis CLY and the bus Y4 the first bus from the center y-axis CLY. There is no bus separating the bus Y3 from the center y-axis CLY and there is no bus separating the bus Y4 from the center y-axis CLY.

FIG. 3B-2 is a diagram of an embodiment to illustrate that currents are symmetric at the locations X2Y3 and X2Y4. The processor 106 of FIG. 1 sends a control signal to the multiplexer 108 (FIG. 1) to close the switches SY3 and SX2 and to open the remaining switches SY1, SY2, SY4 through SY6, SX1, and SX3 through SX6. When the switches SY3 and SX2 are closed and the remaining switches SY1, SY2, SY4 through SY6, SX1, and SX4 through SX6 are open, a normal current $IN_7'$ flows from the voltage source Vs through a path $N_7'$ to the ground potential. The path $N_7'$ starts at voltage source Vs and extends via the switch SY3, the bus Y3, the heater at the location X2Y3, the bus X2, and the switch SX2 to the ground potential. The current meter 202X2 measures the normal current $IN_7'$ at the terminal of the switch SX2.

Similarly, the processor 106 sends a control signal to the multiplexer 108 to close the switches SY4 and SX2 and to open the remaining switches SY1 through SY3, SYS, SY6, SX1, and SX3 through SX6. Upon receiving the control signal, the multiplexer 108 sends signals to the switches SY4 and SX2 to close the switches SY4 and SX2 and does not send signals to the remaining switches SY1 through SY3, SY5, SY6, SX1, and SX3 through SX6 to open the remaining switches SY1 through SY3, SY5, SY6, SX1, and SX3 through SX6.

When the switches SY4 and SX2 are closed, a normal current $IN_8'$ flows from the voltage source Vs through a path $N_8'$ to the ground potential. The path $N_8'$ starts at voltage source Vs and extends via the switch SY4, the bus Y4, the heater at the location X2Y4, the bus X2, and the switch SX2 to the ground potential. The current meter 202X1 measures the normal current $IN_8'$ at the terminal of the switch SX5.

It should be noted that the currents $IN_8'$ and $IN_8'$ are approximately the same or equal due to the fabrication of the heater array 102. The processor 106 receives the measurements of the currents $IN_5'$ and $IN_8'$, and determines that the measurements are symmetric or that the heaters at the locations X2Y3 and X2Y4 are symmetric with respect to each other. For example, the processor 106 determines that the measurement of the current $IN_7'$ is within the pre-set range from the measurement of the current $IN_8'$. The processor 106 determines that the currents are asymmetric between at least one of the locations of heaters along the Y3 and Y4 buses to identify the Y3 and Y4 buses from all the buses Y1 through Y6 of the heater array 102. The locations for which the current are asymmetric along the Y3 and Y4 buses include the locations X1Y3 and X1Y4, X3Y3 and X3Y4, X4Y3 and X4Y4, X5Y3 and X5Y4, and X6Y3 and X6Y4. The currents received from the locations X2Y3 and X2Y4 are symmetric.

Upon determining that not all locations along the X2 and X5 buses are symmetric and not all locations along the Y3 and Y4 buses are symmetric, the processor 106 determines that the X2, X5, Y3, and Y4 are buses along which one or more heaters have failed. For example, the processor 106 determines that the measurements of current between the locations X2Y1 and X5Y1 (FIG. 2B-1) are asymmetric and the measurements of current between the locations X6Y3 and X6Y4 (FIG. 3B-1) are asymmetric, and therefore determines that not all locations along the X2 and X5 buses are symmetric and not all locations along the Y3 and Y4 buses are symmetric.

After identifying the four buses X2, X5, Y3, and Y4 along which one or more heaters have failed, the processor 106 performs a process to confirm that there is a single failure in the heater array 106. For example, the processor 106 executes a process to confirm that only one heater in the heater array 102 has failed or is faulty.

Figure 4A:
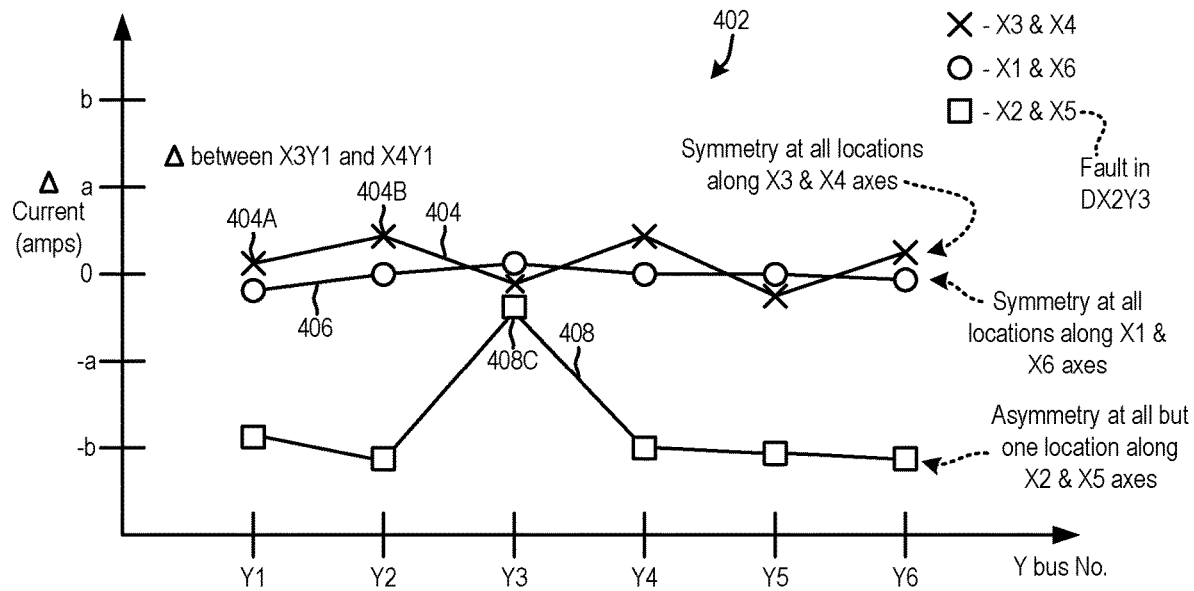
FIG. 4A is an embodiment of a graph to confirm a single failure within the heater array.

FIG. 4A is an embodiment of a graph 402 to confirm a single failure within the heater array 102. The confirmation of the single failure confirms a lack of another faulty heater within the heater array 102 and is performed after identifying the four buses X2, X5, Y3, and Y4. The graph 402 plots a delta Δ or a difference in currents between two locations along two X buses of the heater array 102. The graph includes a plot 404 that illustrates a difference in measurements of current between the locations X3Y1 and X4Y1, X3Y2 and X4Y2, X3Y3 and X4Y3, X3Y4 and X4Y4, X3Y5 and X4Y5, and X3Y6 and X4Y6, which are located along the X3 and X4 buses. To illustrate, the plot 404 has a point 404A that shows a difference in measurements of current between the locations X3Y1 and X4Y1 and has another point 404B that shows a difference in measurements of current between the locations X3Y2 and X4Y2.

Moreover, the graph 402 includes a plot 406 that illustrates a difference in measurements of current between the locations X1Y1 and X6Y1, X1Y2 and X6Y2, X1Y3 and X6Y3, X1Y4 and X6Y4, X1Y5 and X6Y5, and X1Y6 and X6Y6, which are located along the X1 and X6 buses. Also, the graph 402 includes a plot 408 that illustrates a difference in measurements of current between the locations X2Y1 and X5Y1, X2Y2 and X5Y2, X2Y3 and X5Y3, X2Y4 and X5Y4, X2Y5 and X5Y5, and X2Y6 and X5Y6, which are located along the X2 and X5 buses.

The processor 106 of FIG. 1 determines that the measurements of current between all locations along the X3 and X4 buses and all locations along the X3 and X4 buses are symmetric. For example, the processor 106 determines that the measurements of current between the locations X3Y1 and X4Y1 are within the pre-determined range from each other and that the measurements of current between the locations X3Y2 and X4Y2 are within the pre-determined range from each other. In addition, as illustrated with reference to FIGS. 2A-1 and 2A-2, the processor 106 determines that the measurements of currents between all locations along the X1 and X6 buses are symmetric. For example, the processor 106 determines that the measurements of current between the locations X1Y1 and X6Y1 are within the pre-determined range from each other and that the measurements of current between the locations X1Y2 and X6Y2 are within the pre-determined range from each other. Also, as illustrated with reference to FIGS. 2B-1 and 2B-2, the processor 106 determines that the measurements of current between all locations along the X2 and X5 buses are asymmetric except for the measurements of current between the locations X2Y3 and X5Y3. The processor 106 determines that the measurements of current between the locations X2Y3 and X5Y3 are symmetric. The symmetry between the locations X2Y3 and X5Y3 is illustrated by a point 408C on the plot 408.

Figure 4B:
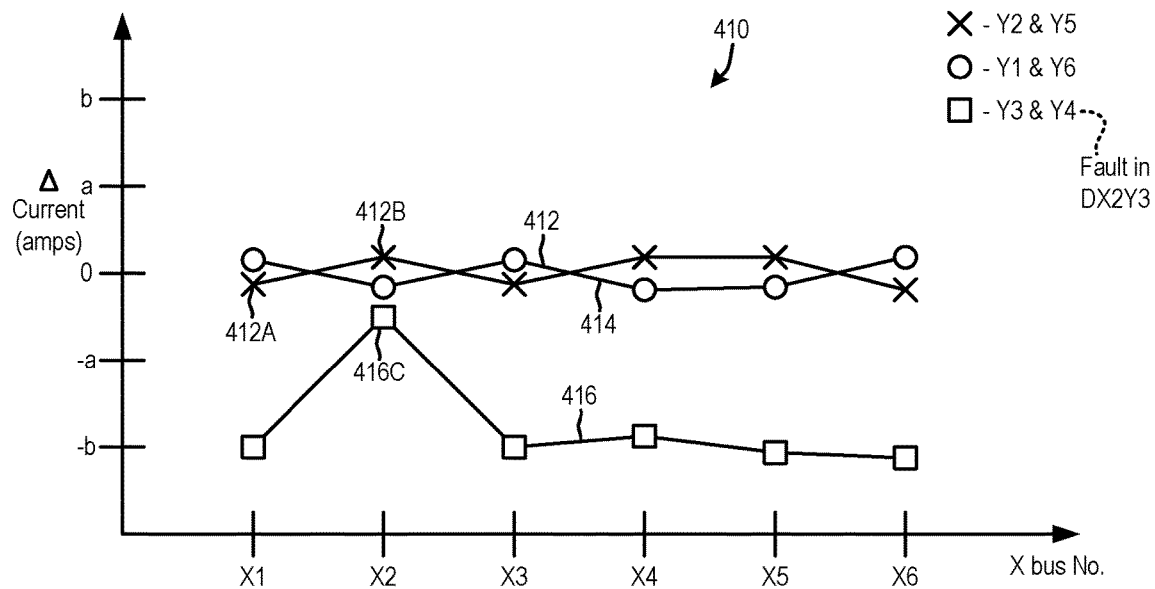
FIG. 4B is an embodiment of a graph to confirm the single failure within the heater array.

FIG. 4B is an embodiment of a graph 410 to confirm the single failure within the heater array 102. The graph 410 plots a delta Δ in currents between two locations along two Y buses of the heater array 102. The graph includes a plot 412 that illustrates a difference in measurements of current between the locations X1Y2 and X1Y5, X2Y2 and X2Y5, X3Y2 and X3Y5, X4Y2 and X4Y5, X5Y2 and X5Y5, and X6Y2 and X6Y5, which are located along the Y2 and Y5 buses. To illustrate, the plot 412 has a point 412A that shows a difference in measurements of current between the locations X1Y2 and X1Y5 and has another point 412B that shows a difference in measurements of current between the locations X2Y2 and X2Y5.

Moreover, the graph 410 includes a plot 414 that illustrates a difference in measurements of current between the locations X1Y1 and X1Y6, X2Y1 and X2Y6, X3Y1 and X3Y6, X4Y1 and X4Y6, X5Y1 and X5Y6, and X6Y1 and X6Y6, which are located along the Y1 and Y6 buses. Also, the graph 410 includes a plot 416 that illustrates a difference in measurements of current between the locations X1Y3 and X1Y4, X2Y3 and X2Y4, X3Y3 and X3Y4, X4Y3 and X4Y4, X5Y3 and X5Y4, and X6Y3 and X6Y4, which are located along the Y3 and Y4 buses.

The processor 106 of FIG. 1 determines that the measurements of current between all locations along the Y2 and Y5 buses and all locations along the Y1 and Y6 buses are symmetric. For example, the processor 106 determines that the measurements of current between the locations X1Y2 and X1Y5 are within the pre-set range from each other and that the measurements of current between the locations X2Y2 and X2Y5 are within the pre-set range from each other. In addition, as illustrated with reference to FIGS. 3A-1 and 3A-2, the processor 106 determines that the measurements of currents between all locations along the Y1 and Y6 buses are symmetric. For example, the processor 106 determines that the measurements of current between the locations X1Y1 and X1Y6 are within the pre-set range from each other and that the measurements of current between the locations X2Y1 and X2Y6 are within the pre-set range from each other. Also, as illustrated with reference to FIGS. 3B-1 and 3B-2, the processor 106 determines that the measurements of current between all locations along the Y3 and Y4 buses are asymmetric except for the measurements of current between the locations X2Y3 and X2Y4. The processor 106 determines that the measurements of current between the locations X2Y3 and X2Y4 are symmetric. The symmetry between the locations X2Y3 and X2Y4 is illustrated by a point 416C on the plot 416.

In response to determining that all locations along the X3 bus and corresponding locations along the X4 bus are symmetric, all locations along the X1 bus and corresponding locations along the X6 bus are symmetric, all locations along the X2 bus and corresponding locations along the X5 bus except for one location along the X2 bus and a corresponding location along the X5 bus are asymmetric, all locations along the Y2 bus and corresponding locations along the Y5 bus are symmetric, all locations along the Y1 bus and corresponding locations along the Y6 bus are symmetric, and all locations along the Y3 bus and corresponding locations along the Y4 bus, except for one location along the Y3 bus and a corresponding location along the Y4 bus are asymmetric, the processor 106 determines and confirms that the single failure exists within the heater array 102. Examples of a location along the X2 bus and a corresponding location along the X5 bus includes the locations that are on the same Y bus. To illustrate, a location along the X2 bus and a corresponding location along the X5 bus include the locations X2Y1 and X5Y1, X2Y2 and X5Y2, X2Y3 and X5Y3, X2Y4 and X5Y4, X2Y5 and X5Y5, or X2Y6 and X5Y6. Examples of a location along the Y3 bus and a corresponding location along the Y4 bus include the locations along the same X bus. To illustrate, a location along the Y3 bus and a corresponding location along the Y4 bus includes the locations X1Y3 and X1Y4, X2Y3 and X2Y4, X3Y3 and X3Y4, X4Y3 and X4Y4, X5Y3 and X5Y4, or X6Y3 and X6Y4. The processor 106 confirms that the single failure exists at a single location along the X2 and X5 and Y3 and Y4 buses. As such, for a single failure confirmation, as illustrated in FIG. 4A, the processor 106 determines that asymmetry exists on only one plot 408 of the graph 402 except that only one location on an x bus and a corresponding single location of another symmetrically located x bus shown on the plot 408 are symmetric. Also, for the single failure confirmation, as illustrated in FIG. 4B, the processor 106 further determines that asymmetry exists on only one plot 416 of the graph 410 except that only one location on a y bus and a corresponding single location of another symmetrically located y bus shown on the plot 416 are symmetric.

Figure 4C:
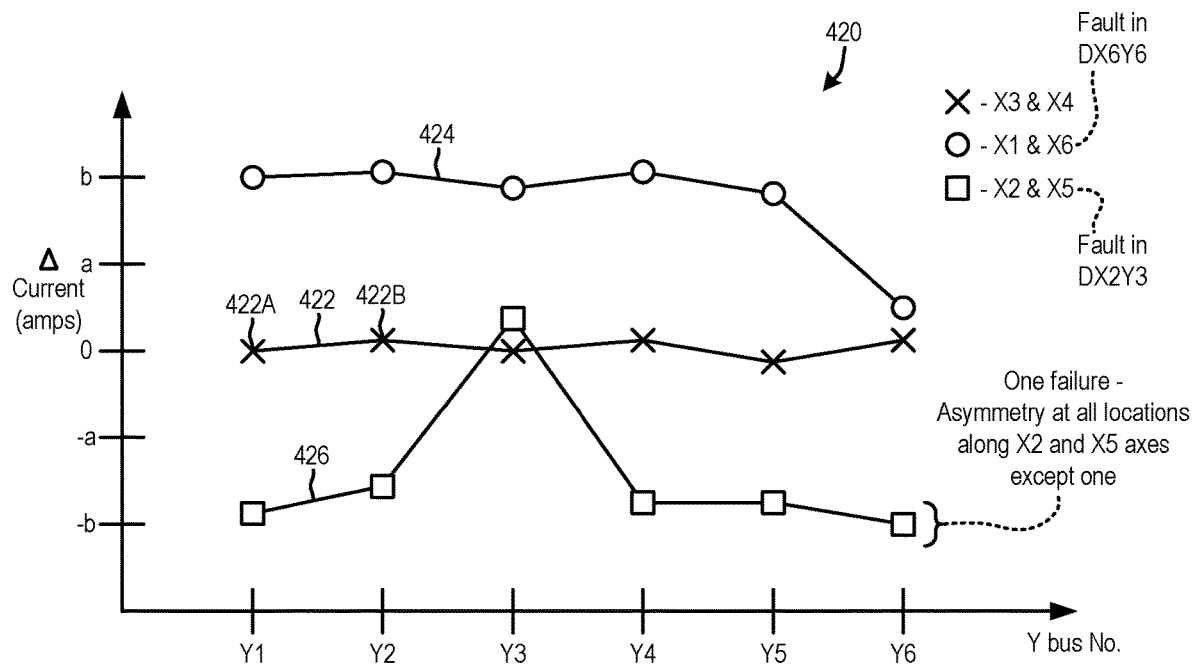
FIG. 4C is an embodiment of a graph to illustrate a greater number of failures than the single failure within the heater array.

FIG. 4C is an embodiment of a graph 420 to illustrate an occurrence of more than one single failure within the heater array 102. For example, the graph 420 is used to determine that the heater array has faults in multiple locations. The graph 420 plots a delta Δ in currents between two locations along two X buses of the heater array 102. The graph 420 includes a plot 422 that illustrates a difference in measurements of current between the locations X3Y1 and X4Y1, X3Y2 and X4Y2, X3Y3 and X4Y3, X3Y4 and X4Y4, X3Y5 and X4Y5, and X3Y6 and X4Y6, which are located along the X3 and X4 buses. To illustrate, the plot 422 has a point 422A that shows a difference in measurements of current between the locations X3Y1 and X4Y1 and has another point 422B that shows a difference in measurements of current between the locations X3Y2 and X4Y2.

Moreover, the graph 420 includes a plot 424 that illustrates a difference in measurements of current between the locations X1Y1 and X6Y1, X1Y2 and X6Y2, X1Y3 and X6Y3, X1Y4 and X6Y4, X1Y5 and X6Y5, and X1Y6 and X6Y6, which are located along the X1 and X6 buses. Also, the graph 420 includes a plot 426 that illustrates a difference in measurements of current between the locations X2Y1 and X5Y1, X2Y2 and X5Y2, X2Y3 and X5Y3, X2Y4 and X5Y4, X2Y5 and X5Y5, and X2Y6 and X5Y6, which are located along the X2 and X5 buses. Because asymmetry exists in more than one plot, such as the plots 424 and 426, within the graph 420, the processor 106 of FIG. 1 determines that there is more than one failure within the heater array 102.

Figure 4D:
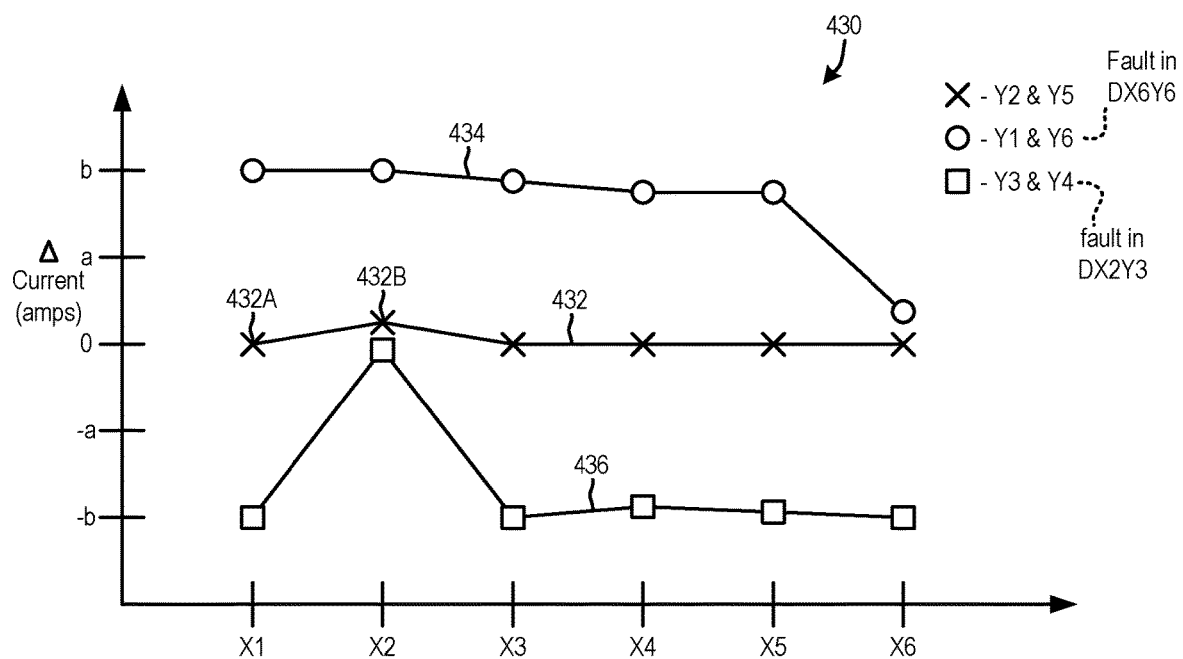
FIG. 4D is an embodiment of a graph to illustrate a greater number of failures than the single failure within the heater array.

FIG. 4D is an embodiment of a graph 430 to illustrate a number of failures greater than the single failure within the heater array 102. The graph 430 plots a delta Δ in currents between two locations along two Y buses of the heater array 102. The graph 430 includes a plot 432 that illustrates a difference in measurements of current between the locations X1Y2 and X1Y5, X2Y2 and X2Y5, X3Y2 and X3Y5, X4Y2 and X4Y5, X5Y2 and X5Y5, and X6Y2 and X6Y5, which are located along the Y2 and Y5 buses. To illustrate, the plot 432 has a point 432A that shows a difference in measurements of current between the locations X1Y2 and X1Y5 and has another point 432B that shows a difference in measurements of current between the locations X2Y2 and X2Y5.

Moreover, the graph 430 includes a plot 434 that illustrates a difference in measurements of current between the locations X1Y1 and X1Y6, X2Y1 and X2Y6, X3Y1 and X3Y6, X4Y1 and X4Y6, X5Y1 and X5Y6, and X6Y1 and X6Y6, which are located along the Y1 and Y6 buses. Also, the graph 430 includes a plot 436 that illustrates a difference in measurements of current between the locations X1Y3 and X1Y4, X2Y3 and X2Y4, X3Y3 and X3Y4, X4Y3 and X4Y4, X5Y3 and X5Y4, and X6Y3 and X6Y4, which are located along the Y3 and Y4 buses. Because asymmetry exists in more than one plot, such as the plots 434 and 436, within the graph 430, the processor 106 of FIG. 1 determines that there is more than one failure within the heater array 102.

FIG. 4E is an embodiment of a graph 440 to illustrate an occurrence of a number of failures greater than one within the heater array 102. For example, the graph 440 is used to determine that the heater array 102 has faults in multiple locations. The graph 440 plots a delta Δ in currents between two locations along two X buses of the heater array 102. The graph 440 includes a plot 442 that illustrates a difference in measurements of current between the locations X3Y1 and X4Y1, X3Y2 and X4Y2, X3Y3 and X4Y3, X3Y4 and X4Y4, X3Y5 and X4Y5, and X3Y6 and X4Y6, which are located along the X3 and X4 buses.

Moreover, the graph 440 includes a plot 444 that illustrates a difference in measurements of current between the locations X1Y1 and X6Y1, X1Y2 and X6Y2, X1Y3 and X6Y3, X1Y4 and X6Y4, X1Y5 and X6Y5, and X1Y6 and X6Y6, which are located along the X1 and X6 buses. Also, the graph 440 includes a plot 446 that illustrates a difference in measurements of current between the locations X2Y1 and X5Y1, X2Y2 and X5Y2, X2Y3 and X5Y3, X2Y4 and X5Y4, X2Y5 and X5Y5, and X2Y6 and X5Y6, which are located along the X2 and X5 buses. Because a single asymmetry between two locations exists in only one plot 446, the processor 106 determines that it is not the case that all locations on the plot 446 except for one are asymmetric to further determine that there is more than one fault or that multiple heaters have failed in the heater array 102.

FIG. 4F is an embodiment of a graph 450 to illustrate a number of failures greater than the single failure within the heater array 102. The graph 450 plots a delta Δ in currents between two locations along two Y buses of the heater array 102. The graph 450 includes a plot 452 that illustrates a difference in measurements of current between the locations X1Y2 and X1Y5, X2Y2 and X2Y5, X3Y2 and X3Y5, X4Y2 and X4Y5, X5Y2 and X5Y5, and X6Y2 and X6Y5, which are located along the Y2 and Y5 buses.

Moreover, the graph 450 includes a plot 454 that illustrates a difference in measurements of current between the locations X1Y1 and X1Y6, X2Y1 and X2Y6, X3Y1 and X3Y6, X4Y1 and X4Y6, X5Y1 and X5Y6, and X6Y1 and X6Y6, which are located along the Y1 and Y6 buses. Also, the graph 450 includes a plot 456 that illustrates a difference in measurements of current between the locations X1Y3 and X1Y4, X2Y3 and X2Y4, X3Y3 and X3Y4, X4Y3 and X4Y4, X5Y3 and X5Y4, and X6Y3 and X6Y4, which are located along the Y3 and Y4 buses.

Because a single asymmetry exists in only one plot 456, the processor 106 determines that it is not the case that all locations on the plot 456 except for one are asymmetric to further determine that there is more than one fault or that multiple heaters have failed in the heater array 102.

Figure 5:
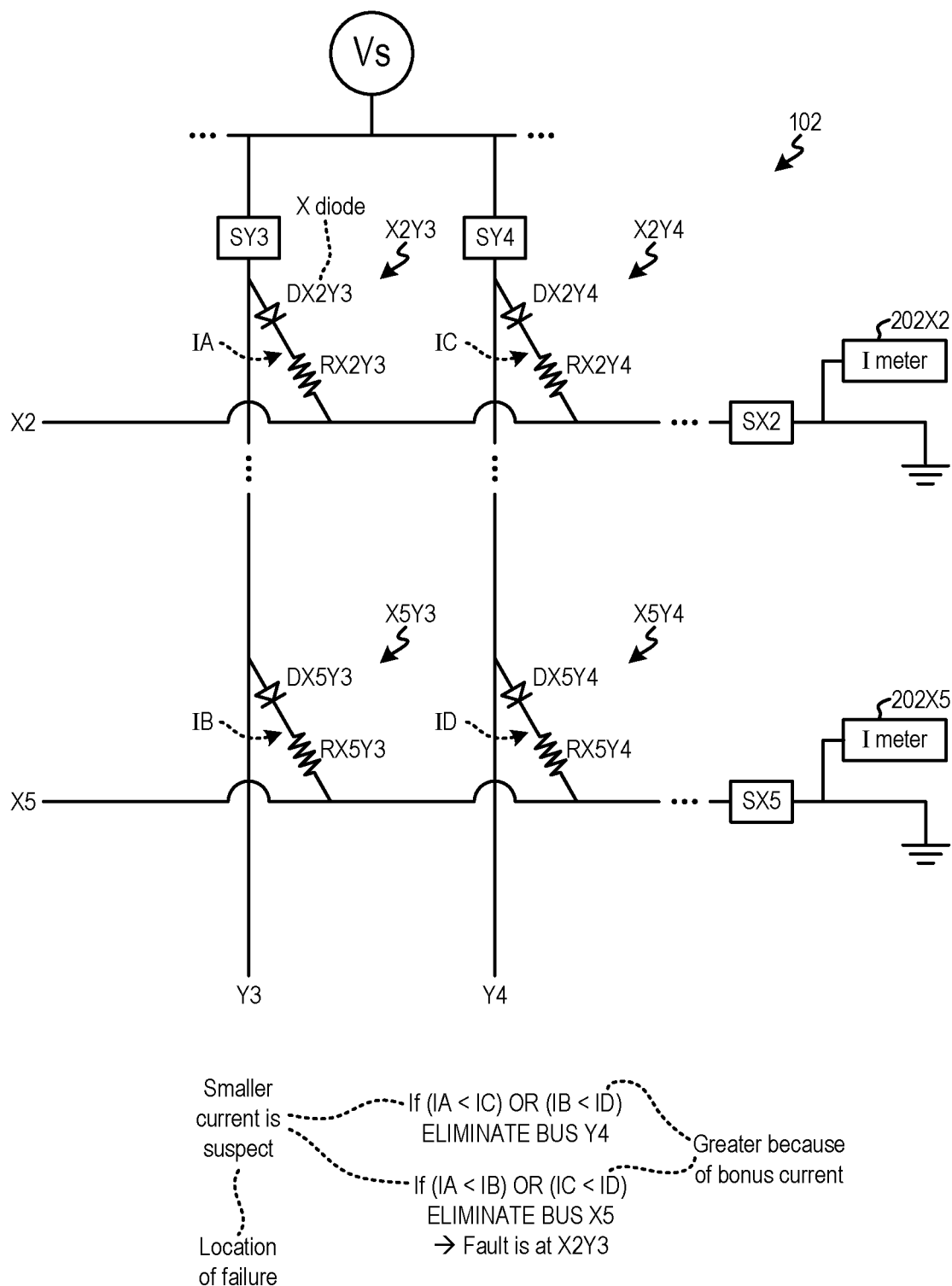
FIG. 5 is a diagram of an embodiment of the heater array to illustrate a determination of a location of failure within the heater array.

FIG. 5 is a diagram of an embodiment of the heater array 102 illustrate a determination of the single location of failure within the heater array 102. The determination of the single location of failure is made by the processor 106 of FIG. 1 after confirming the single failure within the heater array 102. The confirmation of the single failure is illustrated above with reference to FIGS. 4A-4F. In FIG. 4A, the outlier plot 408 is identified by the processor 106 and hence X2 and X5 buses are identified by the processor 106 as suspects. Also, in FIG. 4B, the outlier plot 416 is identified by the processor 106 and hence Y3 and Y4 buses are identified by the processor 106 as suspects. Referring to FIG. 2B-1, the locations along the X2 bus do not receive the extraneous current as a result of the failed heater at the location X2Y3 while the locations along the X5 bus receive the extraneous current. Refer to FIG. 3B-1, the locations along the Y3 bus do not receive the extraneous current as a result of the failed heater at the location X2Y3 in an associated current meter measurement as measured by the current meter 202X6 while the locations along the Y4 bus receive the extraneous current in an associated current meter measurement as measured by the current meter 202X6. An example of the extraneous current as metered by the current meter 202X6 is IUW8. Therefore, one of the buses X2 and X5 with smaller current and one of the buses Y3 and Y4 with smaller current is suspected by the processor 106.

It should be noted that a heater's current, as described herein, includes a measurement of the current by a current meter associated with the heater when the heater is actively addressed. For example, a current passing through the heater at the location X6Y4 is a measurement of the current by the current meter 202X6 that is associated with the heater when the heater is actively addressed. The heater at the location X6Y4 is actively addressed by the processor 106. The processor 106 controls the multiplexer 108 to close the switches SY4 and SX6. When the switches SY4 and SX6 are closed, the current meter 202X6 meters the current I($N_8$+UW8), as illustrated with reference to FIG. 3B-1.

The processor 106 compares four currents IA through ID, corresponding to the locations X2Y3, X2Y4, X5Y3, and X5Y4, that are obtained during the failure confirmation process. For example, the processor 106 applies a first process to determine whether the current IA is less that the current IC or the current IB is less than the current ID. Upon determining that the current IA is less that the current IC or the current IB is less than the current ID, the processor 106 eliminates the bus Y4 as being one on which the failed heater is located. In this example, the processor 106 applies a second process to determine whether the current IA is less than the current IB or whether the current IC is less than the current ID. Upon determining that the current IA is less than the current IB or the current IC is less than the current ID, the processor 106 eliminates the bus X5 as being one on which the faulty heater is located. The processor 106 determines that the current IA is less than the current IC and is less than the current IB to determine that the failure location is at X2Y3. The faulty location X2Y3 of the failed heater is stored by the processor 106 in the memory device 114 of FIG. 1 as mitigation data.

It should be noted that the current IA is measured when the processor 106 controls the multiplexer 108 of FIG. 1, during the failure confirmation process, to further control the switch SY3 and the switch SX2 to close and to control the remaining switches SY1, SY2, SY4 through SY6, SX1, and SX3 through SX6 to open. When the switches SY3 and SX2 are closed and the remaining switches SY1, SY2, SY4 through SY6, SX1, and SX3 through SX6 are open, the current meter 202X2 measures the amount IA of current that passes from the voltage source VS via the switch SY3, the bus Y3, the heater at the location X2Y3, the bus X2, and the switch SX2 to the ground potential.

Similarly, the current IC is measured when the processor 106 controls the multiplexer 108, during the failure confirmation process, to further control the switch SY4 and the switch SX2 to close and to control the remaining switches SY1 through SY3, SYS and SY6, SX1, and SX3 through SX6 to open. When the switches SY4 and SX2 are closed and the remaining switches SY1 through SY3, SYS and SY6, SX1, and SX3 through SX6 are open, the current meter 202X2 measures the amount IC of current that passes from the voltage source VS via the switch SY4, the bus Y4, the heater at the location X2Y4, the bus X2, and the switch SX2 to the ground potential.

Moreover, the current IB is measured when the processor 106 controls the multiplexer 108, during the failure confirmation process, to further control the switch SY3 and the switch SX5 to close and to control the remaining switches SY1, SY2, SY4 through SY6, SX1 through SX4, and SX6 to open. When the switches SY3 and the switch SX5 are closed and the remaining switches SY1, SY2, SY4 through SY6, SX1 through SX4, and SX6 are open, the current meter 202X5 measures the amount IB of current that passes from the voltage source VS via the switch SY3, the bus Y3, the heater at the location X5Y3, the bus X5, and the switch SX5 to the ground potential.

Also, the current ID is measured when the processor 106 controls the multiplexer 108, during the failure confirmation process, to further control the switch SY4 and the switch SX5 to close and to control the remaining switches SY1 through SY3, SY5 and SY6, SX1 through SX4, and SX6 to open. When the switches SY4 and SX5 are closed and the remaining switches SY1 through SY3, SY5 and SY6, SX1 through SX4, and SX6 are open, the current meter 202X5 measures the amount ID of current that passes from the voltage source VS via the switch SY4, the bus Y4, the heater at the location X5Y4, the bus X5, and the switch SX5 to the ground potential.

Figure 6:
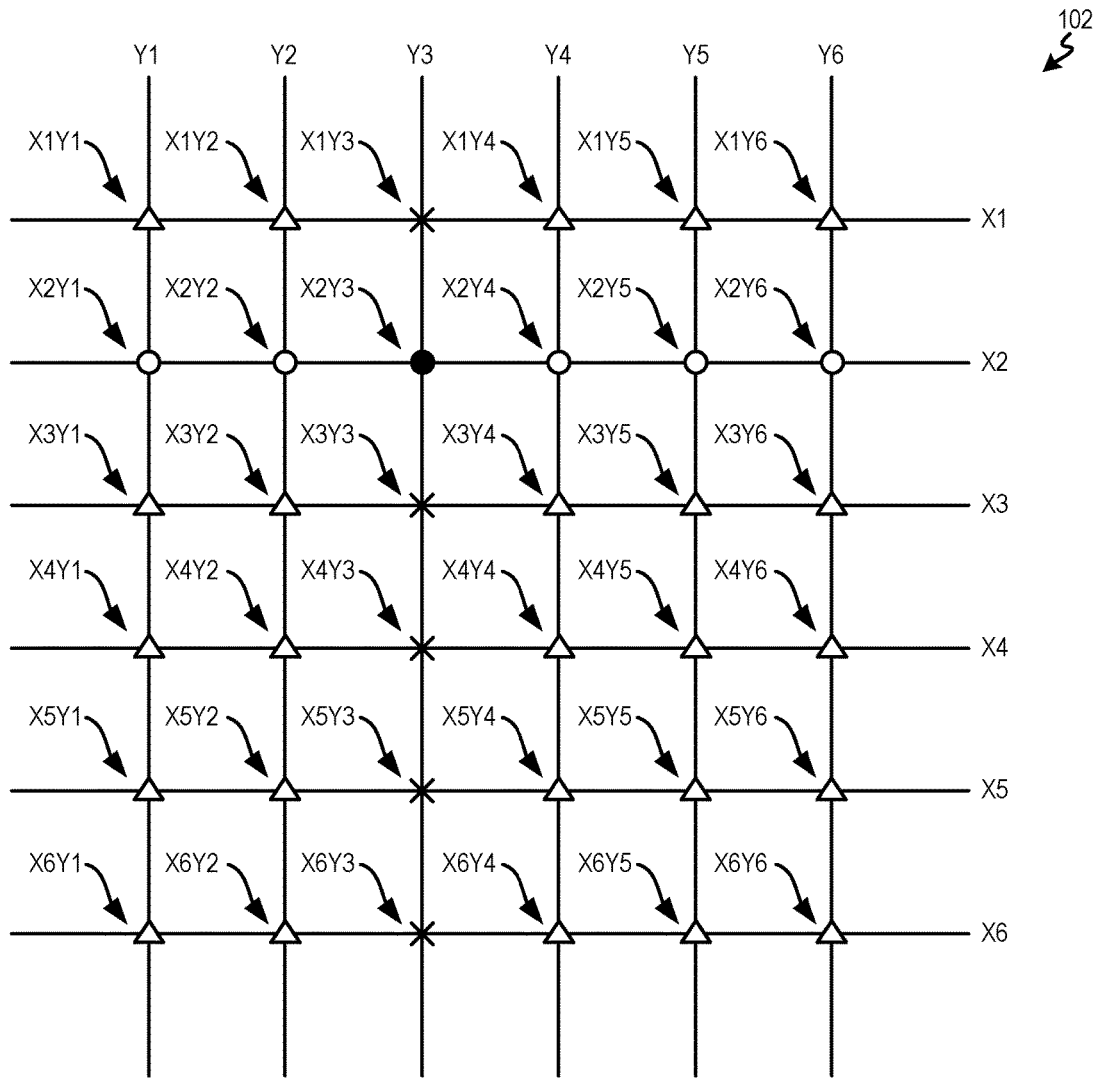
FIG. 6 is a diagram of an embodiment of the heater array to illustrate adjustment of duty cycle of operation of a number of heaters within the heater array to compensate for the single failure at the location X2Y3 of a faulty heater within the heater array.

FIG. 6 is a diagram of an embodiment of the heater array 102 to illustrate adjustment of duty cycle of operation of a number of heaters within the heater array 102 to compensate for the single failure at the location X2Y3 of the faulty heater within the heater array 102. The location X2Y3 is illustrated as dot in FIG. 6. Moreover, locations that are on or along the same Y bus having the location X2Y3 are shown as Xs and are labeled as group two. Also, locations that are on or along the same X bus having the location X2Y3 are shown as circles and are labeled as group 3. The remaining locations of the heater array that are not on or along the same X bus or the same Y bus having the location X2Y3 are shown as triangles and are labeled as a group one.

After determining the existence of the single failure at the location X2Y3 within the heater array 102, the processor 106 accesses, such as reads, the mitigation data from the memory device 114 of FIG. 1 to identify the location X2Y3 of the faulty heater in the heater array 102, and controls duty cycles of operation of a number of heaters of the heater array 102 to achieve the temperature value Temp1 within the plasma chamber for processing a substrate within the plasma chamber. For example, after determining the existence of the single failure at the location X2Y3, the processor 106 maintains duty cycles of the group one heaters that are not on the same X bus or the same Y bus having the location X2Y3 and does not modify the duty cycles. The duty cycles of the group one heaters that are not on the same X bus or the same Y bus having the location X2Y3 are the same before and after the identification of the location of the single failure. Moreover, in this example, the processor 106 changes or adjusts original duty cycles DCX of the group two heaters at the locations that are on the same Y bus having the location X2Y3 to output adjusted duty cycles DCXA. To illustrate, the processor 106 reduces or decreases an original duty cycle DCXa of the heater at the location X3Y3 by a product of the original duty cycle DCXa and an extraneous amount of power that is provided to the location X3Y3 from the voltage source Vs to output the adjusted duty cycle DCXAa for the heater at the location X3Y3. The extraneous amount of power is provided to the heater at the location X3Y3 due to the single failure of the heater at the location X2Y3. The extraneous amount of power is a percentage of power supplied by the voltage source Vs. The processor 106 generates a difference between the original duty cycle DCXa of the heater at the location X3Y3 and a product of the original duty cycle DCXa of the heater and the extraneous amount of power provided to the location X3Y3 to output the adjusted duty cycle DCXAa. The processor 106 controls the heater at the location X3Y3 via the multiplexer 108 and the switches SX3 and SY3 so that the heater at the location X3Y3 operates at the adjusted duty cycle DCXAa.

Continuing with the example, the processor 106 changes or adjusts original duty cycles DCO of the group three heaters at the locations that are on the same X bus having the location X2Y3 to output adjusted duty cycles DCOA. To illustrate, the processor 106 reduces an original duty cycle DCOa of the heater at the location X2Y4 by a product of the original duty cycle DCOa of the heater and an extraneous amount of power that is provided to the location X2Y4 from the voltage source Vs to output an adjusted duty cycle DCOAa for the heater at the location X2Y4. The extraneous amount of power is provided to the heater at the location X2Y4 due to the single failure of the heater at the location X2Y3. The extraneous amount of power is a percentage of the power supplied by the voltage source Vs. The processor 106 generates a difference between the original duty cycle DCOa of the heater at the location X2Y4 and a product of the original duty cycle DCOa of the heater and the extraneous amount of power provided to the location X2Y4 to output the adjusted duty cycle DCOAa. The processor 106 controls the heater at the location X2Y4 via the multiplexer 108 and the switches SX2 and SY4 so that the heater at the location X2Y4 operates at the adjusted duty cycle DCOAa.

Moreover, in the example, the processor 106 changes or adjusts an original duty cycle DC of the faulty heater at the location X2Y3 to output an adjusted duty cycle DCA of the heater. To illustrate, the processor 106 reduces the original duty cycle DC of the heater at the location X2Y3 by a product of the original duty cycle DC of the heater and an extraneous amount of power that is provided to the location X2Y3 from the voltage source Vs to output the adjusted duty cycle DCA for the heater at the location X2Y3. The extraneous amount of power is provided to the heater at the location X2Y3 due to the single failure of the heater at the location X2Y3. The single failure at the location X2Y3 causes extraneous current at remaining locations within the heater array 102 and some of the extraneous current at the remaining locations leaks back into the heater at the location X2Y3. The processor 106 generates a difference between the original duty cycle DC of the heater at the location X2Y3 and a product of the original duty cycle DC of the heater and the extraneous amount of power provided to the location X2Y3 to generate the adjusted duty cycle DCA. The processor 106 controls the heater at the location X2Y3 via the multiplexer 108 and the switches SX2 and SY3 so that the heater at the location X2Y3 operates at the adjusted duty cycle DCA.

The processor 106 applies the adjusted duty cycle DCA to the heater at the location X2Y3, the adjusted duty cycles DCXA to the heaters at the locations along or on the X bus having the location X2Y3, and the adjusted duty cycles DCOA to the heaters at the locations along or on the Y bus having the location X2Y3 to compensate for the failure in the heater at the location X2Y3. For example, the processor 106 controls the multiplexer 108 to close the switches SY3 and SX2 and to open the remaining switches SY1, SY2, SY4 through SY6, SX1, and SX3 through SX6 for an amount of time to apply power from the voltage source Vs to the heater at the location X2Y3 within the heater array 102 to achieve the adjusted duty cycle DCA. As another example, the processor 106 controls the multiplexer 108 to close the switches SY3 and SX1 and to open the remaining switches SY1, SY2, SY4 through SY6, and SX2 through SX6 for an amount of time to apply power from the voltage source Vs to the heater at the location X1Y3 to achieve an adjusted duty cycle for the heater at the location X1Y3. Also, as another example, the processor 106 controls the multiplexer 108 to close the switches SY4 and SX2 and to open the remaining switches SY1 through SY3, SY5, SY6, SX1, and SX3 through SX6 for an amount of time to apply power from the voltage source Vs to the heater at the location X2Y4 to achieve an adjusted duty cycle for the heater at the location X2Y4. It should be noted that a reduction in a duty cycle of a heater of the heater array 102 reduces power that is supplied from the voltage source Vs to the heater by reducing an amount of time for which the power is supplied.

The processor 106 maintains the duty cycles of the remaining heaters at the locations X1Y1, X1Y2, X1Y4, X1Y5, X1Y6, X3Y1, X3Y4, X3Y5, X3Y6, X4Y1, X4H2, X4Y4, X4Y5, X4Y6, X5Y1, X5Y2, X5Y4, X5Y5, X5Y6, X6Y1, X6Y2, X6Y4, X6Y5, and X6Y6 to be the same as that before the failure at the location X2Y3 is identified. The processor 106 does not adjust or change the duty cycles of the remaining heaters. The duty cycles of the heaters at the locations illustrated using the dot, the circles, and the Xs are adjusted, such as reduced, to prolong a life of the heater array 102 and of a part of the plasma chamber in which the heater array 102 is embedded. Examples of the part include the substrate support, the chuck, the showerhead, and the upper electrode assembly.

It should be noted that a thermal profile with the adjusted duty cycles of the heater array 102 with the single failure is identical to a thermal profile with the original duty cycles of the heater array 102 without the single failure. Thus, wafer processing recipes do not change after adjusting the original duty cycles.

In one embodiment, the processor 106 stores the adjusted duty cycles DCA, DCOA, and DCXA within the non-volatile memory 110 in which the duty cycles DC, DCO, and DCX are stored. The adjusted duty cycles DCA, DCOA, and DCXA are used to achieve the temperature value Temp1 within the plasma chamber. The methods described above with reference to FIGS. 1-6 for identifying the buses of the heater array 102 having the location of the faulty heater, confirming that there is only one failure in the heater array 102, identifying the location of the failure, and determining the adjusted duty cycles DCA, DCOA, and DCXA are performed before or during processing the substrate within the plasma chamber. When methods described above with reference to FIGS. 1-6 are performed before processing the substrate, there is no additional computation overhead during the processing. The adjusted duty cycles DCA, DCOA, and DCXA are applied during the processing without determining the adjusted duty cycles during the processing.

FIG. 7 is a diagram of an embodiment of a plasma system 700 to illustrate use of the heater array 102 within a capacitively coupled plasma (CCP) chamber 702. The plasma system 700 includes the plasma chamber 702, a radio frequency generator (RFG) 704, an impedance matching circuit (IMC) 706, the user interface system 112, and the multiplexer 108. An impedance matching circuit, as used herein, is sometimes referred to as an impedance matching network or an impedance match. An input of the impedance matching circuit 706 is coupled to the RF generator 704 via an RF cable and an output of impedance matching circuit 706 is coupled to a lower electrode 712 of the plasma chamber 702 via an RF transmission line.

An impedance matching circuit, as described herein, is a network of one or more components, such as one or more resistors, or one or more capacitors, or one or more inductors, or a combination thereof, that match an impedance of a load coupled to an output of the impedance matching circuit with an impedance of a source coupled to one or more inputs of the impedance matching circuit. Examples of the load coupled to the output of impedance matching circuit 706 include the plasma chamber 702 and the RF transmission line. Moreover, examples of the source coupled to the input of the impedance matching circuit 706 include the RF cable and the RF generator 704.

The plasma chamber 702 includes an upper electrode 708 and a substrate support 710, such as a chuck. The substrate support 710 includes the heater array 102 and a lower electrode 712. On a top surface of the substrate support 710, a substrate S, such as a semiconductor wafer, is placed for processing of the substrate S. Examples of processing the substrate S include depositing a material on the substrate S, etching the substrate S, cleaning the substrate S, and sputtering the substrate S. The substrate support 710 faces the upper electrode 708. The upper electrode 708 is coupled to a ground potential. Each of the lower electrode 712 and the upper electrode 708 is made from a metal, such as aluminum or an alloy of aluminum. The lower electrode 712 is located above the heater array 102.

The user interface system 112 is coupled to the RF generator 704 via a transfer cable. The processor 106 of the user interface system 112 provides one or more power levels and/or one or more frequency levels to the RF generator 704. The one or more power levels and the one or more frequency levels are a portion of the recipe, which is stored in the memory device 114 of the user interface system 112. The RF generator 704 generates an RF signal having the one or more power levels and/or the one or more frequency levels and supplies the RF signal via the RF cable to the impedance matching circuit 706. The impedance matching circuit 706 matches an impedance of the load coupled to the output of the impedance matching circuit 706 with that of the source coupled to the input of the impedance matching circuit 706 to generate a modified RF signal from the RF signal received via the RF cable 712. The impedance matching circuit 706 provides the modified RF signal via the RF transmission line 718 to the lower electrode 712 of the plasma chamber 702.

When the one or more process gases are supplied to the plasma chamber 702 in addition to supplying the modified RF signal, plasma is stricken or maintained within the plasma chamber 702 to process the substrate S. Examples of the one or more process gases include an oxygen-containing gas, such as $O_2$. Other examples of the one or more process gases include a fluorine-containing gas, e.g., tetrafluoromethane ($CF_4$), sulfur hexafluoride ($SF_6$), hexafluoroethane ($C_2F_6$), etc.

Before or during processing of the substrate S, the processor 106 of the user interface system 112 applies the method described above with reference to FIGS. 1-5 to identify the single location of failure of a heater within the heater array 102 of the substrate support 710. Once the single location of failure is identified the processor 106 adjusts the original duty cycles DC, DCO, and DCX to the corresponding adjusted duty cycles DCA, DCOA, and DCXA to achieve the temperature value Temp1 within the plasma chamber 702. The duty cycles DC, DCO, and DCX are adjusted during processing of the substrate S.

In an embodiment, instead of being embedded within the substrate support 710, the heater array 102 is embedded within the upper electrode assembly that includes the upper electrode 708 and the lower electrode 712 is coupled to the ground potential.

In one embodiment, instead of being embedded within the substrate support 710, the heater array 102 is embedded within the upper electrode assembly that includes the upper electrode 708 and the lower electrode 712 is coupled to one or more RF generators.

In an embodiment, instead of being coupled to the ground potential, the upper electrode 708 is coupled to one or more RF generators.

FIG. 8 is a diagram of an embodiment of a system 800 to illustrate use of the heater array 102 within a showerhead 802 of a plasma chamber 804. The system 800 includes the voltage source Vs, the multiplexer 108, the user interface system 112, the radio frequency generator 704, the impedance matching circuit 706, and the plasma chamber 804.

The output of the impedance matching circuit 706 is coupled to the upper electrode 708 within the showerhead 802 via an RF transmission line. The plasma chamber 804 includes a substrate support 806 that faces the showerhead 802 to form a process gap between the showerhead 802 and the substrate support 806. Within the substrate support 806, the lower electrode 712 is embedded. Moreover, the heater array 102 is embedded within the showerhead 802. The heater array 102 is located above the upper electrode 708. The lower electrode 712 is coupled to the ground potential. The substrate S is placed on top of the substrate support 806 for processing of the substrate S.

Upon receiving the RF signal from the RF generator 704, the impedance matching circuit 706 modifies the RF signal received to match an impedance of a load coupled to the output of the impedance matching circuit 706 with an impedance of the source coupled to the input of impedance matching circuit 706 to output a modified RF signal. An example of the load coupled to the output of the impedance matching circuit 706 includes the plasma chamber 804 and the RF transmission line that couples the impedance matching circuit 706 to the showerhead 802.

The showerhead 802 includes multiple holes that are used to transfer the one or more process gases or one or more liquid metals to the process gap between the showerhead 802 and the substrate support 806. When the one or more process gases or the one or more liquid metals are supplied to the gap between the showerhead 802 and the substrate support 806 in addition to supplying the modified RF signal from the impedance matching circuit 706 to the upper electrode 708, plasma is stricken or maintained within the process gap to process the substrate S. For example, the showerhead 802 is used to perform plasma enhanced atomic layer deposition (PEALD) or plasma enhanced chemical vapor deposition (PECVD) on the substrate S.

Before or during processing of the substrate S, the processor 106 of the user interface system 112 applies the method described above with reference to FIGS. 1-5 to identify the single location of failure of a heater within the heater array 102 embedded within the showerhead 802. Once the single location of failure is identified the processor 106 adjusts the original duty cycles DC, DCO, and DCX to the corresponding adjusted duty cycles DCA, DCOA, and DCXA to achieve the temperature value Temp1 within the plasma chamber 804.

In an embodiment, instead of the lower electrode 712 being coupled to the ground potential, the upper electrode 708 is coupled to the ground potential and the lower electrode 712 is coupled to the RF generator 704 via an RF transmission line (not shown), an impedance matching circuit (not shown), and an RF cable (not shown).

In one embodiment, the upper electrode 708 is coupled to the RF generator 704 and the lower electrode 712 is coupled to another RF generator (not shown) via an impedance matching circuit (not shown).

FIG. 9 is a diagram of an embodiment of a system 900 to illustrate use of the heater array 102 within an inductively coupled plasma (ICP) chamber 902. The system 900 includes the user interface system 112, the multiplexer 108, the RF generator 704, the impedance matching circuit 706, an RF coil 904, and the plasma chamber 902. The plasma chamber 902 includes a dielectric window 906. The RF coil 904 is located above the dielectric window 906.

An output of impedance matching circuit 706 is coupled via an RF transmission line to the RF coil 904. The plasma chamber 902 includes the substrate support 710, within which a lower electrode 712 is embedded. The heater array 102 is located within the substrate support 710. The lower electrode 712 is coupled to the ground potential. The heater array 102 is located below the lower electrode 712. The substrate S is overlaid on top of the substrate support 710 for processing.

Upon receiving the RF signal from the RF generator 704, the impedance matching circuit 706 matches an impedance of a load coupled to the output of the impedance matching circuit 706 with that of the source coupled to the input of the impedance matching circuit 706 to output a modified RF signal at the output of the impedance matching circuit. An example of the load coupled to the output of impedance matching circuit includes the RF transmission line coupled to the output of the impedance matching circuit 706 and the RF coil 904. The RF coil 904 receives the modified RF signal from the output of impedance matching circuit 706 via the RF transmission line. When the one or more process gases are supplied to the plasma chamber 702 and RF power of the modified RF signal that is provided to the RF coil 904 is inductively coupled with the plasma chamber 702, plasma is stricken or maintained within the plasma chamber 702 to process the substrate S.

Before or during processing of the substrate S, the processor 106 of the user interface system 112 applies the method described above with reference to FIGS. 1-5 to identify the single location of failure of a heater within the heater array 102 embedded within the substrate support 710. Once the single location of failure is identified the processor 106 adjusts the original duty cycles DC, DCO, and DCX to the corresponding adjusted duty cycles DCA, DCOA, and DCXA to achieve the temperature value Temp1 within the plasma chamber 902.

In some embodiments, instead of the RF coil 904, multiple RF coils are located above the dielectric window 906. In various embodiments, instead of or in addition to the RF coil 904, one or more RF coils are located adjacent to a side wall of the plasma chamber 702. In several embodiments, a Faraday shield is placed below and adjacent to the dielectric window 906 to clean the dielectric window 906 to free the dielectric window 906 from materials that are deposited on the dielectric window 906.

In various embodiments, the lower electrode 712 is coupled to another RF generator (not shown) via an impedance matching circuit instead of being coupled to the ground potential.

Figure 10A:
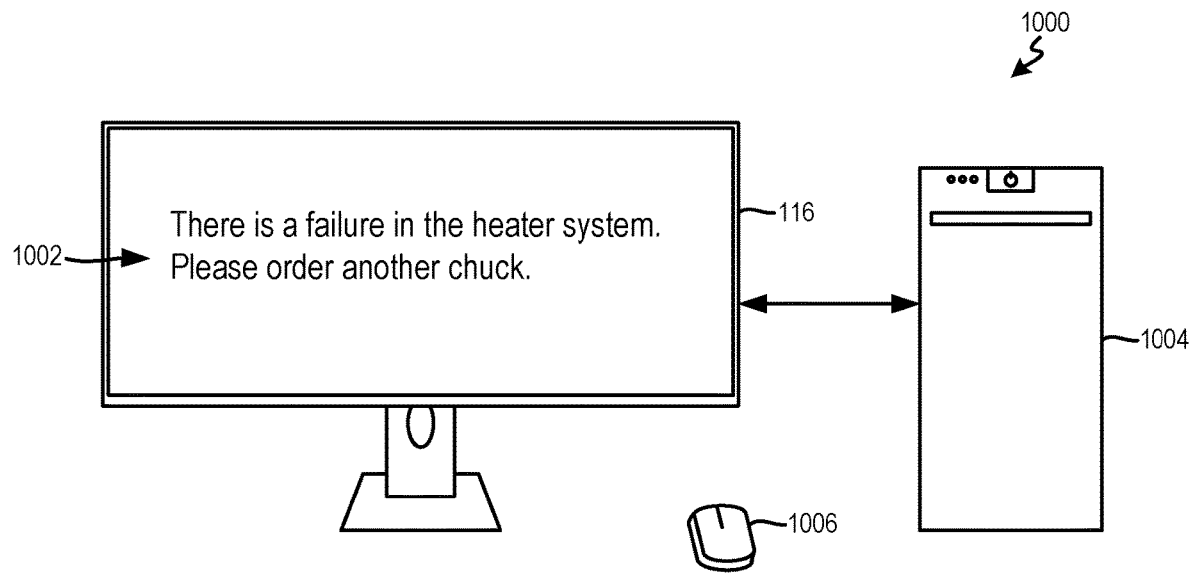
FIG. 10A is a diagram of an embodiment of a system to illustrate a notification that is displayed on a display device when the single failure in the heater array of is confirmed or when the location of failure of the heater in the heater array is identified by a processor.

FIG. 10A is a diagram of an embodiment of a system 1000 to illustrate a notification 1002 that is displayed on the display device 116 when the single failure in the heater array 102 of FIG. 1 is confirmed or when the single location of failure of the heater in the heater array 102 is identified by the processor 106 (FIG. 1). The system 1000 includes the display device 116, a central processing unit (CPU) 1004, and a mouse 1006. The CPU 1004 has a housing that encloses the processor 106. The mouse 1006 is an example of an input device that the user uses to provide commands to the processor 106.

Upon confirming the single failure within the heater array 102, the processor 106 controls the display device 116 to display the notification 1002. The notification 1002 indicates to the user that there is a failure in the heater array 102, which is an example of a heater system. Moreover, the notification 1002 indicates to the user that the user should order another chuck in which the heater array 102 is situated.

In one embodiment, the processor 106 controls the display device 116 to display the notification 1002 when the single location, such as the location X2Y3, within the heater array is identified by the processor 106.

Figure 10B:
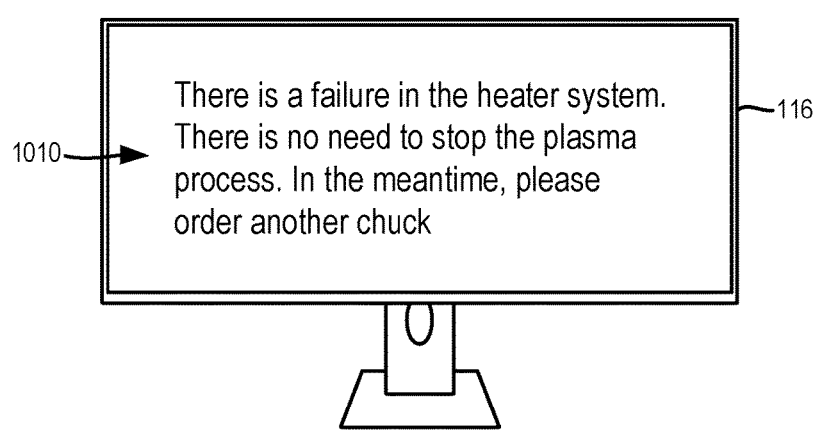
FIG. 10B is a diagram of an embodiment of the display device to illustrate another notification that is displayed on the display device when the single failure in the heater array of is confirmed or when the location of failure of the heater in the heater array is identified.

FIG. 10B is a diagram of an embodiment of the display device 116 to illustrate another notification 1010 that is displayed on the display device 116 when the single failure in the heater array 102 of FIG. 1 is confirmed or when the single location of failure of the heater in the heater array 102 is identified by the processor 106 (FIG. 1). The notification 1010 indicates to the user that there is a failure in the heater array 102 and that there is no need to stop processing of the substrate S due to the failure. The notification 1010 further indicates that the user should order another chuck.

In one embodiment, a notification, such as the notification 1002 of FIG. 10A or the notification 1010, is displayed on the display device 116 before, during, or after adjustment of the duty cycles DC, DCO, and DCX by the processor 106.

In an embodiment, instead of a notification that is displayed, the processor 106 controls and audio device to output a sound that indicates that there is a failure in the heater array 102 and that the user should order a replacement part for a substrate support or a showerhead in which the heater array 102 is embedded.

The provision of the notification to the user saves processing time of substrates. While the replacement part is being received by the user, the processor 106 continues to control a plasma system, such as the system 700 of FIG. 7, or the system 800 of FIG. 8, or the system 900 of FIG. 9, to process the substrate S and additional substrates. There is none or minimal downtime for processing the substrate S and additional substrates due to the single failure at the location X2Y3 within the heater array 102 because the processor 102 applies the adjusted duty cycles DCA, DCOA, and DCXA while the replacement part is being received by the user.

It should be noted that the location X2Y3 is for exemplary purposes. In an embodiment, instead of the heater at the location X2Y3, another heater at another location within the heater array 102 can have a fault or failure.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller, as described herein, is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks coupled to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more microprocessors, or microcontrollers that execute program instructions (e.g., software). The program instructions are instructions communicated to the controller in the form of various individual settings (or program files), defining the parameters, the factors, the variables, etc., for carrying out a particular process on or for a semiconductor wafer or to a system. The program instructions are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to a system over a network, which includes a local network or the Internet. The remote computer includes a user interface that enables entry or programming of parameters and/or settings, which are then communicated to the system from the remote computer. In some examples, the controller receives instructions in the form of data, which specify the parameters, factors, and/or variables for each of the processing steps to be performed during one or more operations. It should be understood that the parameters, factors, and/or variables are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems to which the methods are applied include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that is associated or used in the fabrication and/or manufacturing of semiconductor wafers.

It is further noted that in some embodiments, the above-described operations apply to several types of plasma chambers, e.g., a plasma chamber including an inductively coupled plasma (ICP) reactor, a transformer coupled plasma chamber, conductor tools, dielectric tools, a plasma chamber including an electron cyclotron resonance (ECR) reactor, etc. For example, one or more RF generators are coupled to an inductor within the ICP reactor. Examples of a shape of the inductor include a solenoid, a dome-shaped coil, a flat-shaped coil, etc.

As noted above, depending on the process step or steps to be performed by the tool, the host computer communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein.

The invention claimed is:

1. A method for adjusting power supplied to a heater array having a faulty heater, comprising:
  accessing mitigation data that identifies a location of the faulty heater, wherein the faulty heater is located on an X bus and a Y bus;
  adjusting a duty cycle of power to be applied to the faulty heater to output an adjusted duty cycle;
  applying the adjusted duty cycle to the faulty heater, wherein the adjusted duty cycle reduces power to the faulty heater; and
  applying additional adjusted duty cycles to a set of heaters on the X bus and the Y bus without adjusting remaining duty cycles applied to remaining heaters of the heater array, wherein the additional adjusted duty cycles reduce power to the set of heaters.

2. The method of claim 1, wherein the X bus is one of a plurality of X buses of the heater array and the Y bus is one of a plurality of Y buses of the heater array, the method further comprising:
  receiving a plurality of measurements of current output from the plurality of X buses of the heater array;
  receiving a plurality of measurements of current output from the plurality of Y buses of the heater array;
  identifying two X buses from the plurality of X buses for which a first difference between two of the plurality of measurements received from the plurality of X buses is outside a pre-determined range, wherein the two X buses are located symmetrical with respect to a center X axis of the heater array;
  identifying two Y buses from the plurality of Y buses for which a second difference between two of the plurality of measurements received from the plurality of Y buses is outside a pre-set range, wherein the two Y buses are located symmetrical with respect to a center Y axis of the heater array.

3. The method of claim 2, further comprising confirming a lack of failure of another faulty heater within the heater array.

4. The method of claim 3, further comprising:
  receiving a plurality of measurements of current output from the two X buses and the two Y buses;
  identifying the location of the faulty heater from the plurality of measurements of current output from the two X buses and the two Y buses.

5. The method of claim 1, wherein the mitigation data includes the location of the faulty heater, wherein the location of the faulty heater is identified by the X bus and the Y bus.

6. The method of claim 1, wherein said adjusting the duty cycle includes reducing the duty cycle of operation of the faulty heater.

7. The method of claim 1, wherein said applying the additional adjusted duty cycles to the set of heaters on the X bus and the Y bus comprises reducing a plurality of duty cycles of the set of heaters on the X bus and the Y bus.

8. The method of claim 1, wherein the remaining duty cycles applied to the remaining heaters of the heater array are the same before and after the location of the faulty heater is identified.

9. A system comprising:
  a heater array having a plurality of X buses, a plurality of Y buses, and a plurality of heaters distributed within a plasma chamber; and
  a power delivery circuit for setting a duty cycle of power to each of the plurality of heaters,
  wherein the power delivery circuit is configured to adjust the duty cycle of a faulty heater of the plurality of heaters and adjust the duty cycles of power provided to first and second groups of heaters from the plurality of heaters, wherein the plurality of X buses include an X bus associated with the faulty heater, wherein the plurality of Y buses include a Y bus associated with the faulty heater, wherein the first group of heaters is located on the X bus associated with the faulty heater and the second group of heaters is located on the Y bus associated with the faulty heater.

10. The system of claim 9, wherein the power delivery circuit includes a processor configured to:
  receive a plurality of measurements of current output from the plurality of X buses of the heater array;
  receive a plurality of measurements of current output from the plurality of Y buses of the heater array;
  identify two X buses from the plurality of X buses for which a first difference between two of the plurality of measurements received from the plurality of X buses is outside a pre-determined range, wherein the two X buses are located symmetrical with respect to a center X axis of the heater array;
  identify two Y buses from the plurality of Y buses for which a second difference between two of the plurality of measurements received from the plurality of Y buses is outside a pre-set range, wherein the two Y buses are located symmetrical with respect to a center Y axis of the heater array.

11. The system of claim 10, wherein the processor is configured to confirm a lack of failure of another faulty heater within the heater array.

12. The system of claim 11, wherein the processor is configured to:
  receive a plurality of measurements of current output from the two X buses and the two Y buses;
  identify a location of the faulty heater from the plurality of measurements of current output from the two X buses and the two Y buses.

13. The system of claim 12, wherein the power delivery circuit is configured to maintain remaining duty cycles applied to remaining heaters of the heater array to be the same before and after the location of the faulty heater is identified.

14. The system of claim 9, wherein the power delivery circuit includes a processor,
  wherein the processor is configured to identify a location of the faulty heater,
  wherein the location of the faulty heater is identified by the X bus associated with the faulty heater and the Y bus associated with the faulty heater.

15. The system of claim 9, wherein the power delivery circuit is configured to reduce the duty cycle of operation of the faulty heater to adjust the duty cycle of the faulty heater.

16. The system of claim 9, wherein the power delivery circuit is configured to reduce the duty cycles of power provided to the first and second groups of heaters to adjust the duty cycles of power provided to the first and second groups of heaters.

* * * * *